US012598739B2

(12) United States Patent
Chang et al.

(10) Patent No.: US 12,598,739 B2
(45) Date of Patent: Apr. 7, 2026

(54) SEMICONDUCTOR DEVICE

(71) Applicant: SAMSUNG ELECTRONICS CO., LTD., Suwon-si (KR)

(72) Inventors: Jihoon Chang, Yongin-si (KR); Dong-Wan Kim, Hwaseong-si (KR); Dong-Sik Park, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 952 days.

(21) Appl. No.: 17/854,130

(22) Filed: Jun. 30, 2022

(65) Prior Publication Data

US 2023/0189510 A1     Jun. 15, 2023

(30) Foreign Application Priority Data

Dec. 15, 2021     (KR) ........................ 10-2021-0180074

(51) Int. Cl.
*G11C 11/50*          (2006.01)
*H10B 12/00*          (2023.01)

(52) U.S. Cl.
CPC ........... *H10B 12/50* (2023.02); *H10B 12/315* (2023.02); *H10B 12/34* (2023.02)

(58) Field of Classification Search
CPC ....... H10B 12/50; H10B 12/54; H10B 12/315
USPC ....................................................... 365/164
See application file for complete search history.

(56) References Cited

U.S. PATENT DOCUMENTS

| | | | | |
|---|---|---|---|---|
| 5,194,752 A | * | 3/1993 | Kumagai | ............... H10B 12/31 |
| | | | | 365/72 |
| 5,838,038 A | * | 11/1998 | Takashima | ............... G11C 7/18 |
| | | | | 365/174 |
| 6,639,822 B2 | | 10/2003 | Fujisawa et al. | |
| 8,013,375 B2 | * | 9/2011 | Goo | ........................ H10B 12/48 |
| | | | | 257/296 |
| 8,675,430 B2 | | 3/2014 | Kobayashi | |
| 8,837,193 B2 | * | 9/2014 | Oh | ........................ G11C 5/025 |
| | | | | 365/185.12 |
| 8,964,494 B2 | | 2/2015 | Lane et al. | |
| 9,396,776 B2 | | 7/2016 | Yang | |
| 9,666,254 B1 | | 5/2017 | Woo | |
| 10,276,237 B2 | * | 4/2019 | Lee | ........................ H10B 63/34 |

(Continued)

FOREIGN PATENT DOCUMENTS

| | | | | | |
|---|---|---|---|---|---|
| CN | 1901083 A | * | 1/2007 | ............... G11C 7/08 |
| CN | 208225879 U | * | 12/2018 | |

(Continued)

*Primary Examiner* — Viet Q Nguyen
(74) *Attorney, Agent, or Firm* — Muir Patent Law, PLLC

(57)     ABSTRACT

A semiconductor device includes a substrate having an active cell region and an interfacial region adjacent to each other in a first direction, bit lines on the active cell region of the substrate that are spaced apart from each other in a second direction that intersects the first direction, and bit-line pads on the interfacial region of the substrate that are spaced apart from each other in the second direction. Each of the bit lines includes a first bit line and a second bit line that extend in the first direction and are spaced apart from each other in the second direction, a connection part that connects a first end of the first bit line to a second end of the second bit line, and a coupling part that connects one of the bit-line pads to one of the first bit line, the second bit line, and the connection part.

19 Claims, 14 Drawing Sheets

(56)                   References Cited

U.S. PATENT DOCUMENTS

| | | | | |
|---|---|---|---|---|
| 10,680,004 B2 * | 6/2020 | Oh | .......................... | H10B 43/20 |
| 10,748,915 B2 * | 8/2020 | Nojima | .................. | H10B 41/27 |
| 2001/0010643 A1 * | 8/2001 | Higashide | .............. | G11C 5/063 |
| | | | | 365/185.2 |
| 2013/0148412 A1 | 6/2013 | Ohgami | | |
| 2013/0301370 A1 | 11/2013 | Narui | | |
| 2014/0185353 A1 * | 7/2014 | Oh | .......................... | G11C 5/025 |
| | | | | 365/63 |
| 2019/0081053 A1 * | 3/2019 | Nojima | .................. | H10B 41/35 |
| 2022/0139895 A1 * | 5/2022 | Choi | ....................... | H01L 24/20 |
| | | | | 365/185.13 |

FOREIGN PATENT DOCUMENTS

| | | | | |
|---|---|---|---|---|
| KR | 10-1994-0007876 | | 4/1994 | |
| KR | 20220057737 A | * | 5/2022 | ......... H01L 25/0657 |

* cited by examiner

FIG. 9

IL
ILSP
200
BLPD

145

CNT
CON
WL
WL
WL

BL2a

INF1(INF)

102

ACT

EACR

SEMICONDUCTOR DEVICE

CROSS-REFERENCE TO RELATED APPLICATION

This U.S. nonprovisional application claims priority under 35 U.S.C. § 119 to Korean Patent Application No. 10-2021-0180074, filed on Dec. 15, 2021, in the Korean Intellectual Property Office, the disclosure of which is hereby incorporated by reference in its entirety.

BACKGROUND

1. Field

Embodiments relate to a semiconductor device, and more particularly, to a semiconductor memory device.

2. Description of the Related Art

Semiconductor devices have an important role in the electronic industry because of their small size, multi-functionality, and/or low fabrication cost. Semiconductor devices may be categorized as any one of semiconductor memory devices storing logic data, semiconductor logic devices processing operations of logic data, and hybrid semiconductor devices having both memory and logic elements.

Recently, demand for high speed and low power consumption of electronic products require that semiconductor devices embedded in electronic products have high operating speed and/or low operating voltage. For satisfying the above demand, semiconductor devices have been more highly integrated. The high reliability of semiconductor devices has been increasingly required with the advance in the electronic industry, and simultaneously many studies have been conducted on compactness and high integration of semiconductor devices.

SUMMARY

According to some embodiments, a semiconductor device may include a substrate including an active cell region and an interfacial region that is in a first direction of the active cell region; a plurality of bit lines on the active cell region of the substrate and arranged in a second direction that intersects the first direction; and a plurality of bit-line pads on the interfacial region of the substrate and spaced apart from each other in the second direction. Each of the bit lines may include: a first bit line and a second bit line that extend in the first direction and are spaced apart from each other in the second direction; a connection part that connects a first end of the first bit line to a second end of the second bit line; and a coupling part that connects one of the bit-line pads to one of the first bit line, the second bit line, and the connection part.

According to some embodiments, a semiconductor device may include a substrate including a plurality of active cell regions and a plurality of interfacial regions between the active cell regions, the active cell regions being arranged in a first direction; a plurality of bit lines on the active cell regions of the substrate, the bit lines extending in the first direction and being spaced apart from each other in a second direction that intersects the first direction; and a plurality of bit-line pads on the interfacial regions of the substrate and spaced apart from each other in the second direction. The active cell regions may include: a plurality of outermost active cell regions on opposite sides in the first direction; and a plurality of central active cell regions between the outermost active cell regions and arranged in the first direction. The bit lines may include: a plurality of first bit lines and a plurality of second bit lines that are alternately arranged along the second direction on the outermost active cell regions; and a plurality of third bit lines and a plurality of fourth bit lines that are alternately arranged along the second direction on the central active cell regions. A pair of neighboring first and second bit lines among the first bit lines and the second bit lines may be connected to each other through a connection part between the pair of neighboring first and second bit lines. The third bit lines may be connected to the bit-line pads different from the bit-line pads to which the fourth bit lines are connected.

According to some embodiments, a semiconductor device may include a substrate including an active cell region and an interfacial region in a first direction of the active cell region; a plurality of word lines on the active cell region of the substrate, the word lines extending in a second direction that intersects the first direction and being spaced apart from each other in the first direction; a plurality of bit lines on the active cell region of the substrate, the bit lines extending in the first direction and being spaced apart from each other in the second direction; and a plurality of bit-line pads on the interfacial region of the substrate and spaced apart from each other in the second direction. When viewed in a plan view, the bit lines may have a U shape, and each of the word lines may cross twice the bit line. Each of the bit lines may be connected to one of the bit-line pads.

BRIEF DESCRIPTION OF THE DRAWINGS

Features will become apparent to those of skill in the art by describing in detail exemplary embodiments with reference to the attached drawings, in which:

FIGS. 9 and 10 illustrate plan views of section A depicted in FIG. 1, showing a semiconductor device according to some embodiments.

FIG. 12 illustrates a plan view of section A depicted in FIG. 1, showing a semiconductor device according to some embodiments.

DETAILED DESCRIPTION

Figure 1:
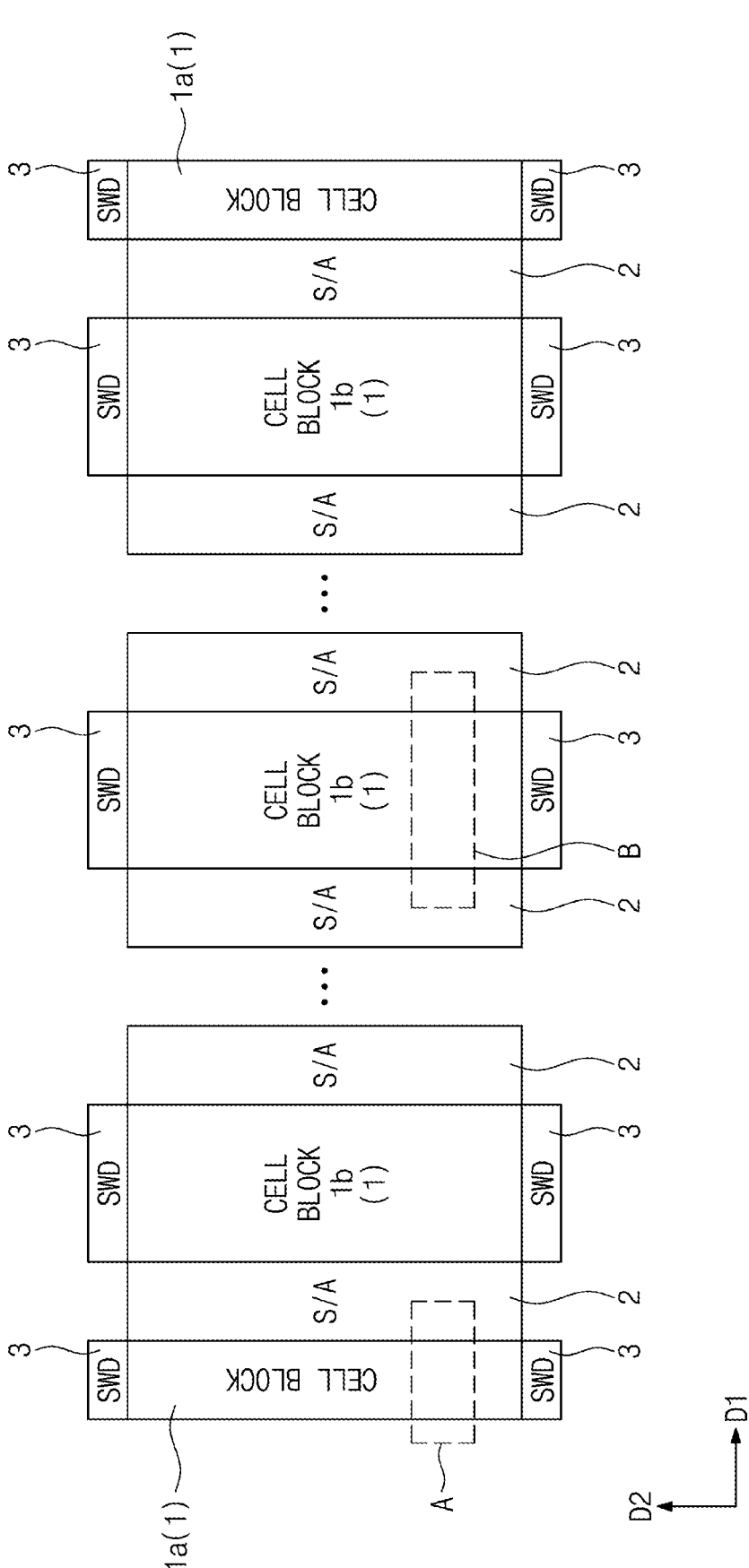
FIG. 1 illustrates a block diagram showing a semiconductor device according to some embodiments.

FIG. 1 illustrates a block diagram showing a semiconductor device according to some embodiments.

Referring to FIG. 1, a semiconductor device may include cell blocks 1 and peripheral blocks 2 and 3 correspondingly disposed around the cell blocks 1. The semiconductor device may be a memory device, and each of the cell blocks 1 may include a cell circuit such as a memory integrated circuit. The peripheral blocks 2 and 3 may include various peripheral circuits required for operation of the cell circuit, and the peripheral circuits may be electrically connected to the cell circuit.

The cell blocks 1 may be arranged in a first direction D1. Outermost cell blocks 1a may be defined to indicate the cell blocks 1 positioned at opposite outermost ends in the first direction D1, and central cell blocks 1b may be defined to indicate the cell blocks 1 positioned between the outermost cell blocks 1a.

The peripheral blocks 2 and 3 may include first peripheral blocks 2 and second peripheral blocks 3 that surround circumferences of corresponding cell blocks 1.

The cell blocks 1 may be arranged in the first direction D1, and the first peripheral blocks 2 may be correspondingly disposed between the cell blocks 1. Between the outermost cell blocks 1a, the first peripheral blocks 2 may be disposed to face each other in the first direction D1 across the central cell blocks 1b.

The second peripheral blocks 3 may be disposed to face each other in a second direction D2 across corresponding cell blocks 1, which second direction D2 intersects the first direction D1. The first and second peripheral blocks 2 and 3 may include sense amplifier (S/A) circuits, sub-word line driver (SWD) circuits, and power and ground driver circuits for driving the sense amplifiers. For example, the sense amplifier (S/A) circuits may be included in the first peripheral blocks 2 that face each other, and the sub-word line driver (SWD) circuits may be included in the second peripheral blocks 3 that face each other. The second peripheral blocks 3 may further include power and ground driver circuits for driving the sense amplifiers.

Figure 2:
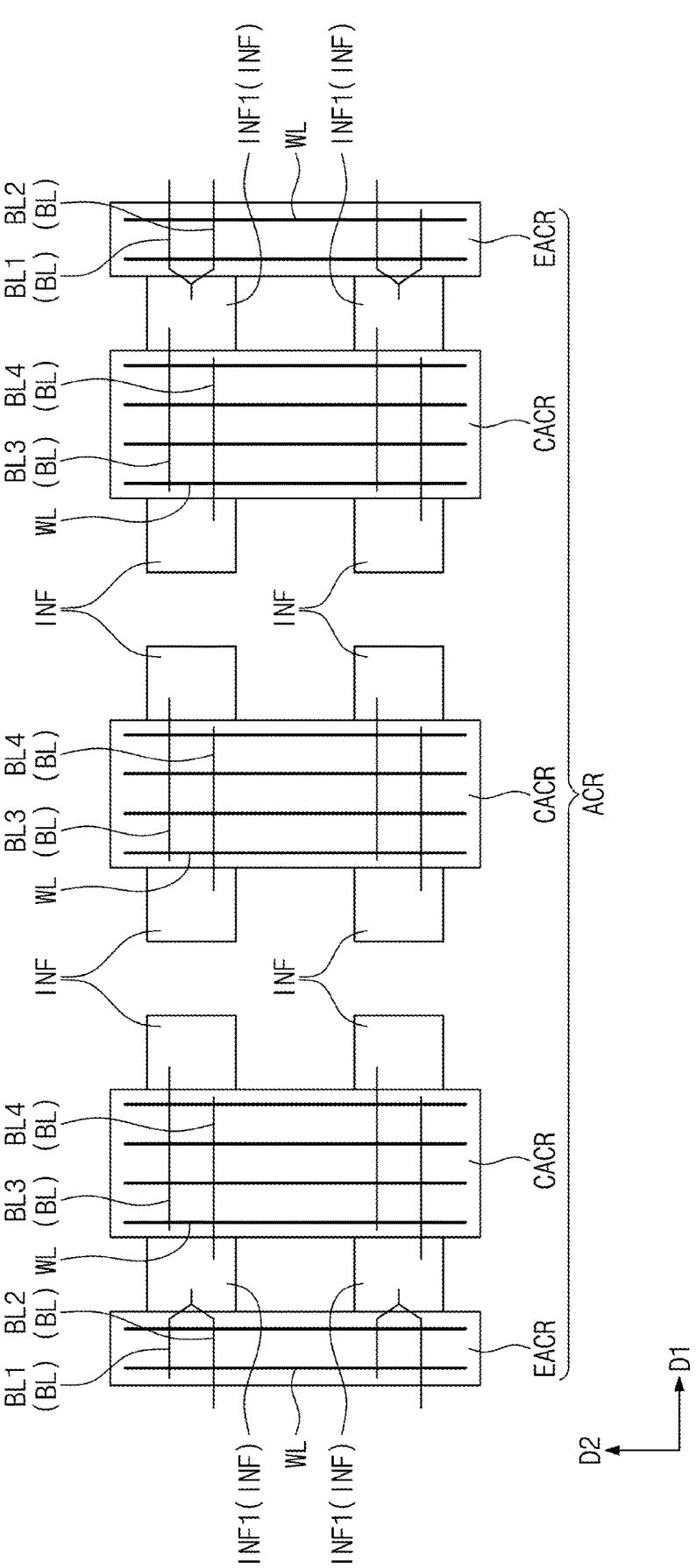
FIG. 2 illustrates a simplified schematic diagram showing an arrangement of bit lines in a semiconductor device according to some embodiments.
Figure 3:
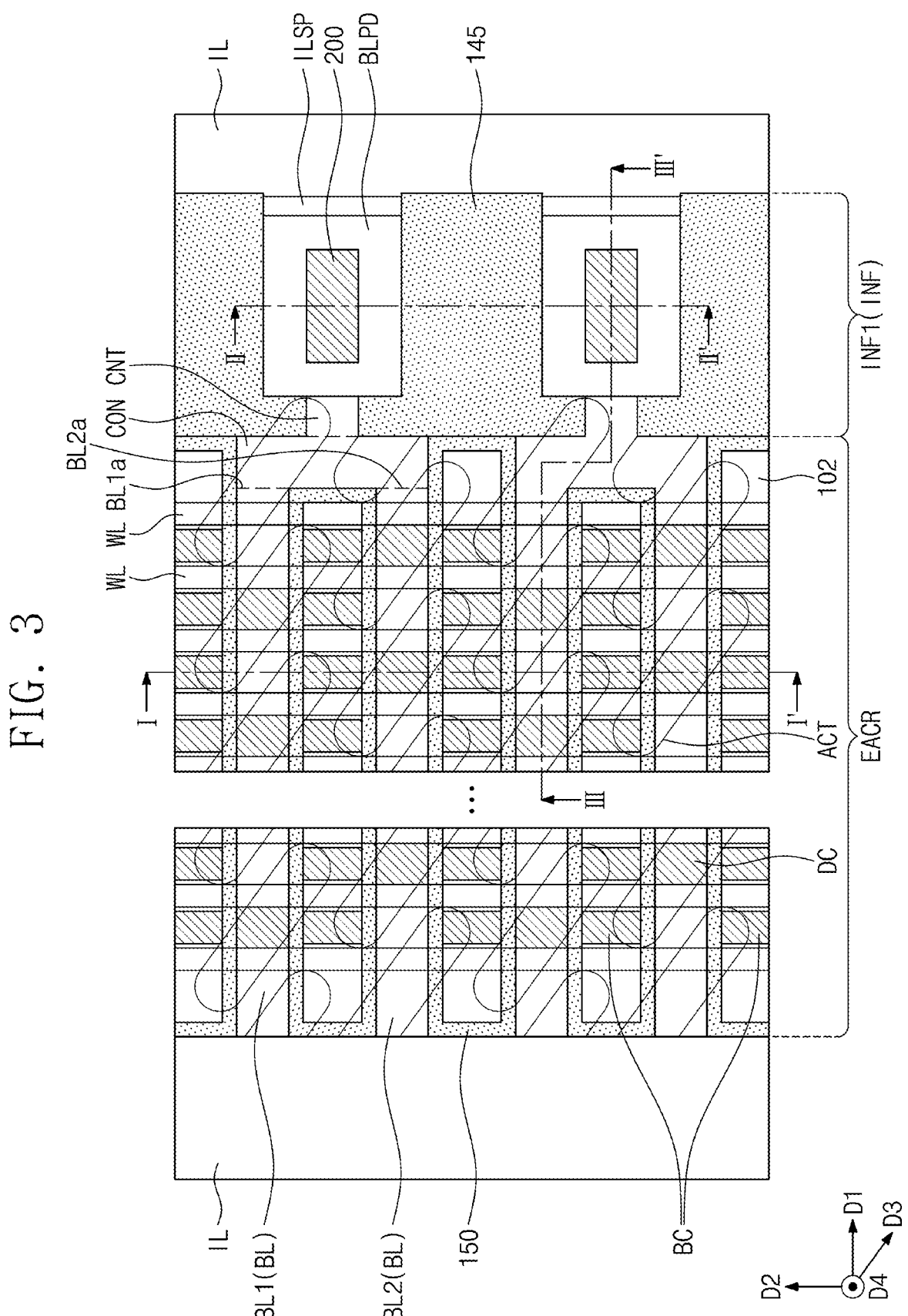
FIGS. 3 and 4 illustrate plan views of section A depicted in FIG. 1, showing a semiconductor device according to some embodiments.
Figure 4:
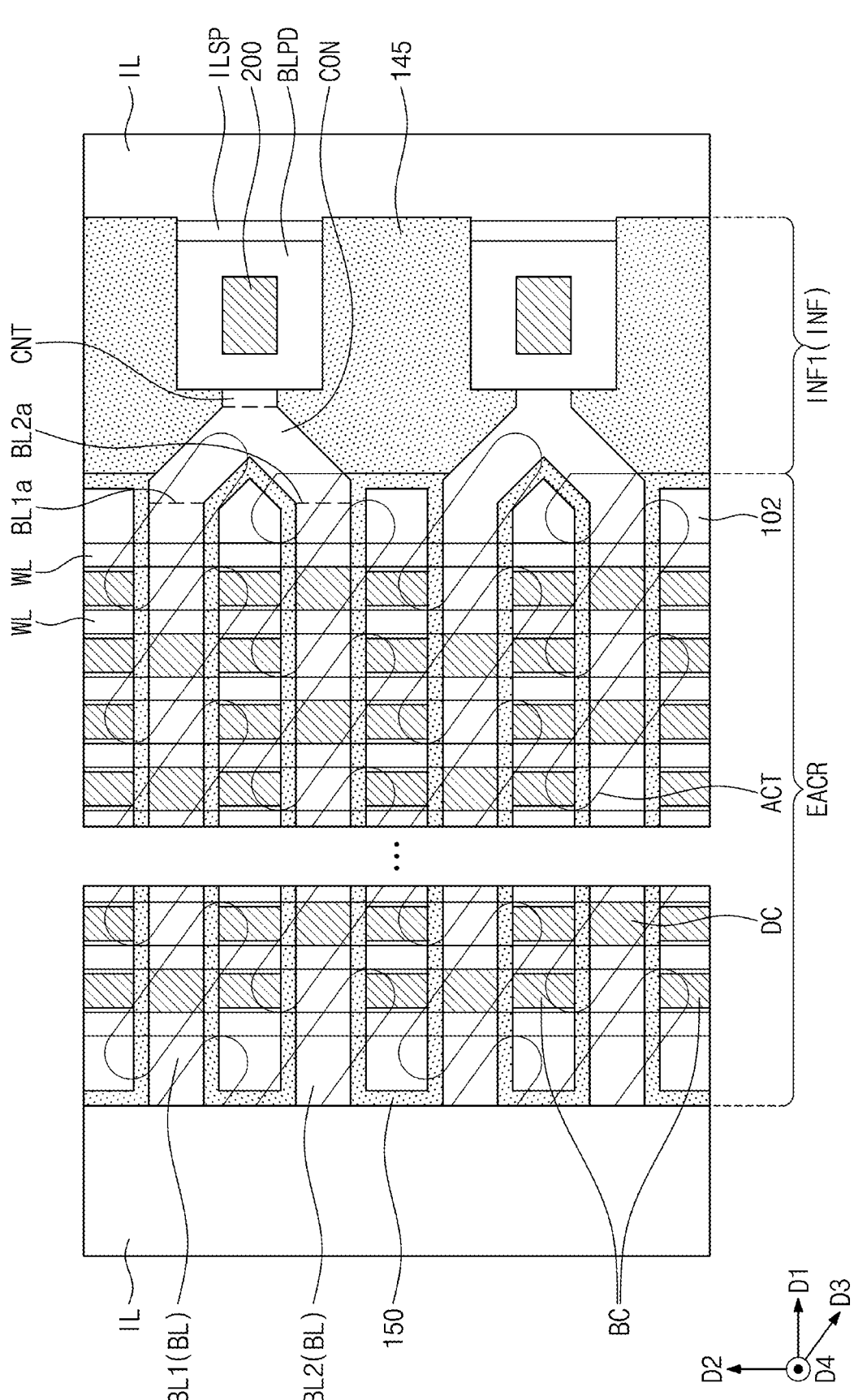
Figure 5:
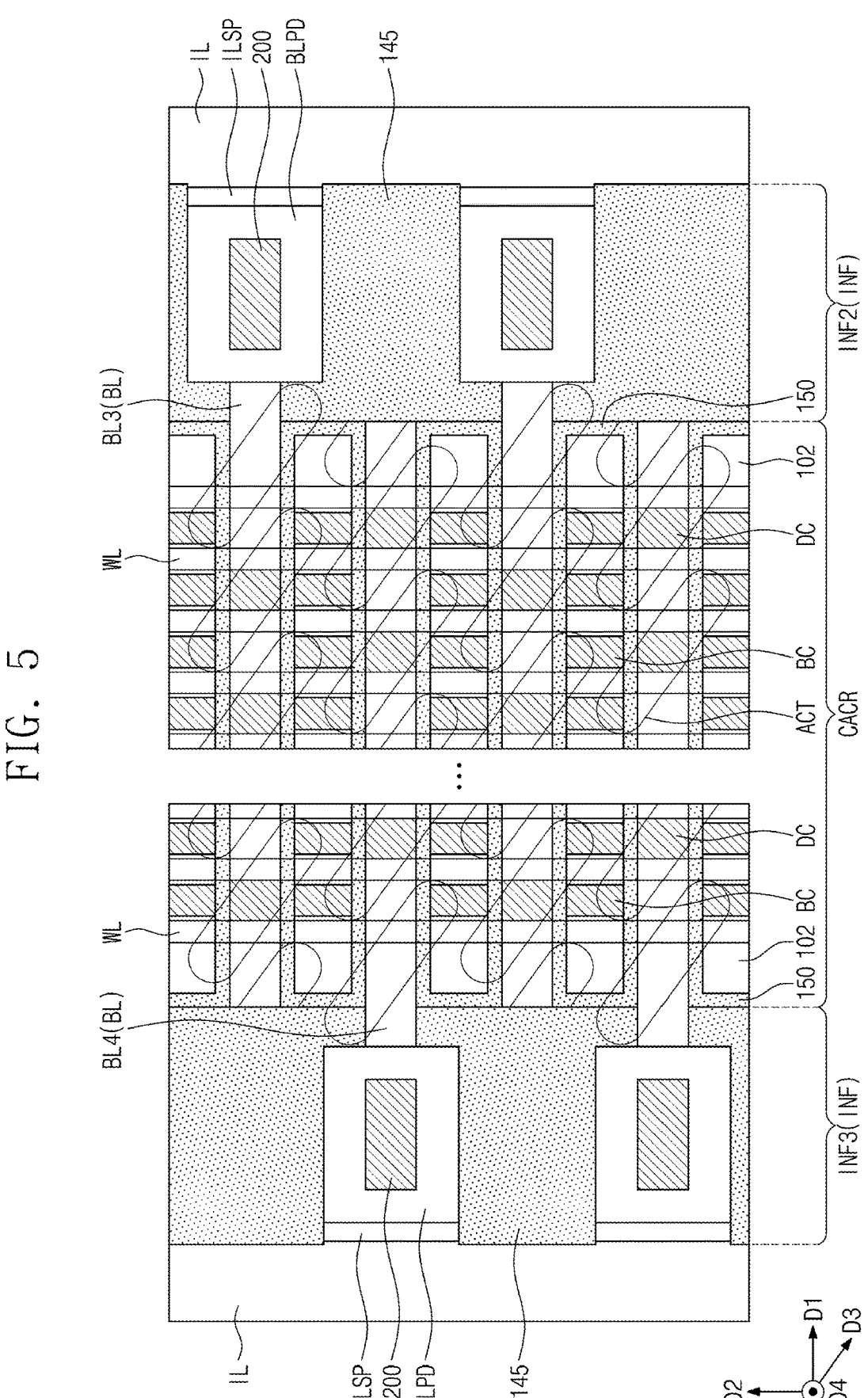
FIG. 5 illustrates a plan view of section B shown in FIG. 1, showing a semiconductor device according to some embodiments.
Figure 6:
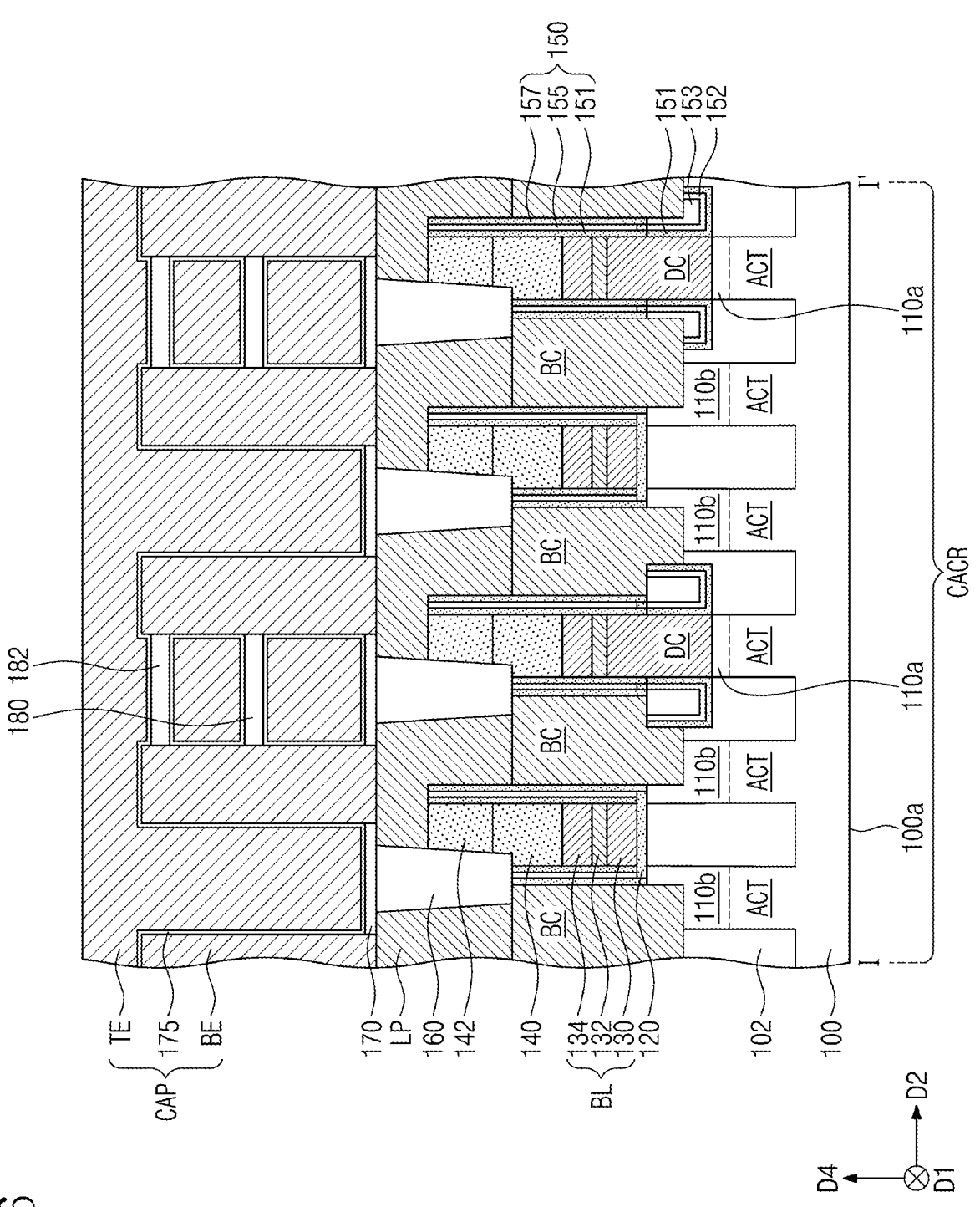
FIG. 6 illustrates a cross-sectional view taken along line I-I' of FIG. 3, showing a semiconductor device according to some embodiments.
Figure 7:
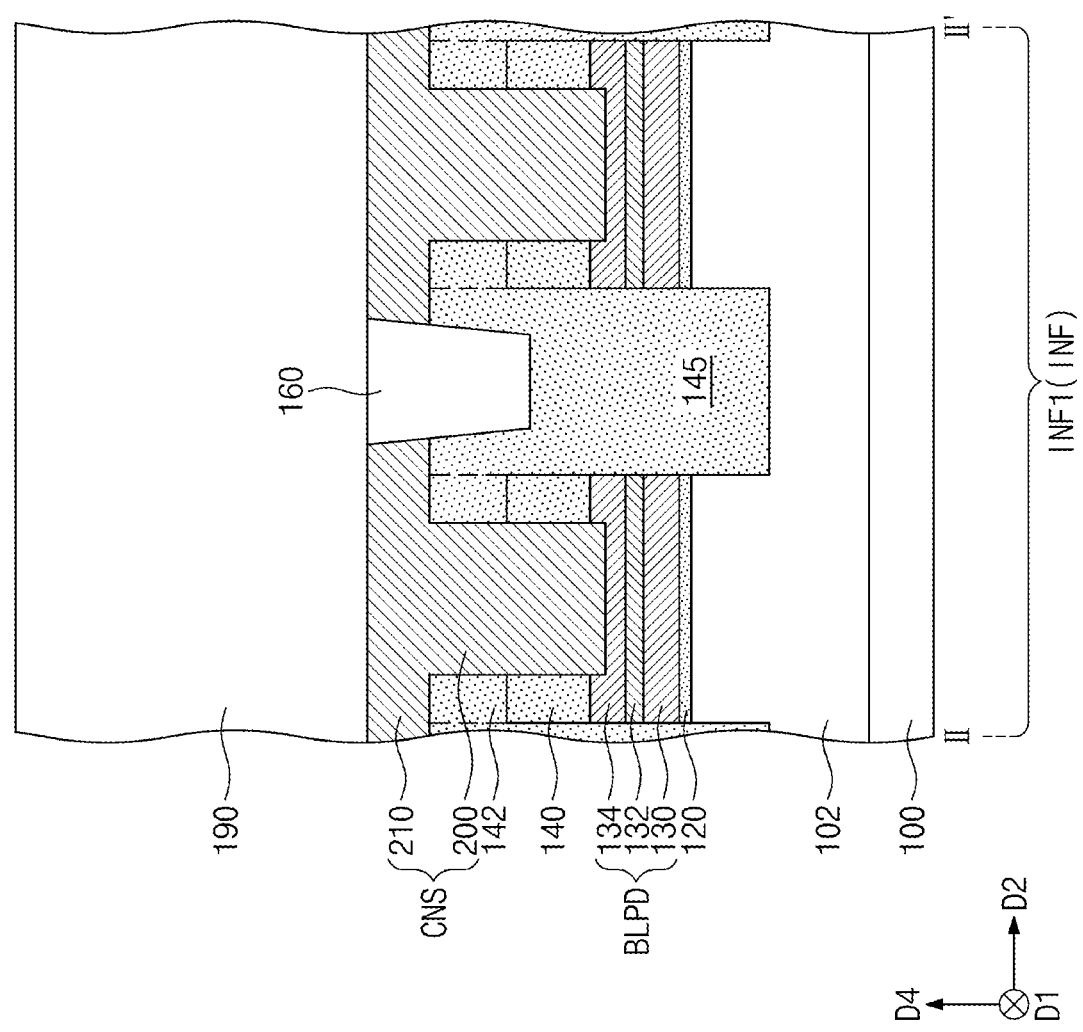
FIG. 7 illustrates a cross-sectional view taken along line II-II' of FIG. 3, showing a semiconductor device according to some embodiments.
Figure 8:
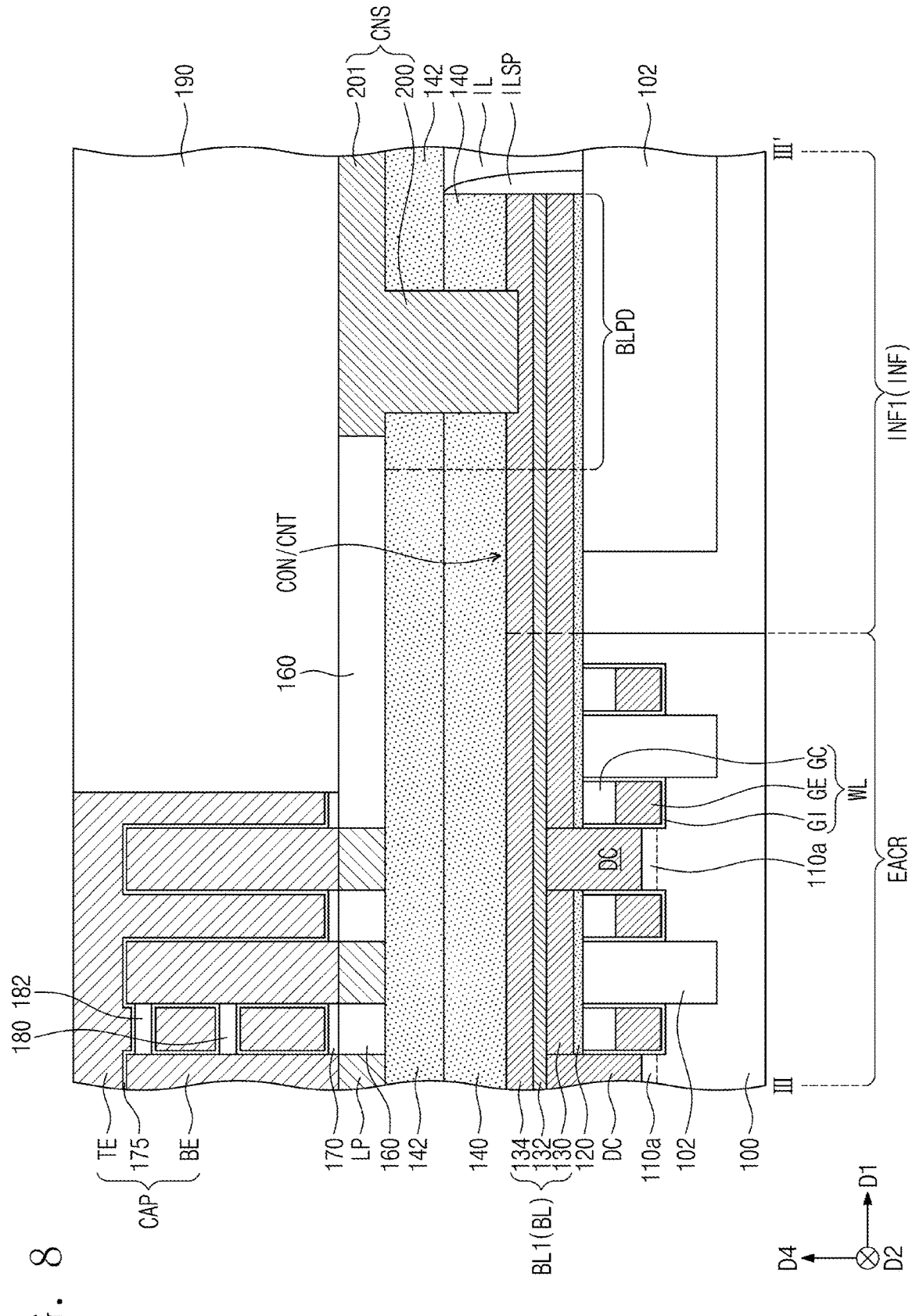
FIG. 8 illustrates a cross-sectional view taken along line II-III' of FIG. 3, showing a semiconductor device according to some embodiments.

FIG. 2 illustrates a simplified schematic diagram showing an arrangement of bit lines in a semiconductor device according to some embodiments. FIGS. 3 and 4 illustrate plan views of section A depicted in FIG. 1, showing a semiconductor device according to some embodiments. FIG. 5 illustrates a plan view of section B shown in FIG. 1, showing a semiconductor device according to some embodiments. FIG. 6 illustrates a cross-sectional view taken along line I-I' of FIG. 3, showing a semiconductor device according to some embodiments. FIG. 7 illustrates a cross-sectional view taken along line II-II' of FIG. 3, showing a semiconductor device according to some embodiments. FIG. 8 illustrates a cross-sectional view taken along line II-III' of FIG. 3, showing a semiconductor device according to some embodiments.

Referring to FIGS. 2 to 8, a substrate 100 may be provided. The substrate 100 may be, e.g., a silicon (Si) substrate, a germanium (Ge) substrate, or a silicon-germanium (SiGe) substrate. The substrate 100 may include active cell regions ACR on each of which the cell block 1 of FIG. 1 is correspondingly provided, peripheral regions on each of which the peripheral block 2 or 3 of FIG. 1 is provided, and interfacial regions INF between the active cell regions ACR and the peripheral regions.

The active cell regions ACR may include outermost active cell regions EACR on each of which is provided the outermost cell block 1a among the cell blocks 1 of FIG. 1, and may also include central active cell regions CACR on each of which is provided the central cell block 1b among the cell blocks 1 of FIG. 1. Likewise the arrangement of the cell blocks 1, the active cell regions ACR may be arranged along the first direction D1. Among the active cell regions ACR, the outermost active cell regions EACR may be positioned at opposite ends in the first direction D1, and the central active cell regions CACR may be arranged in the first direction D1 between the outermost active cell regions EACR. The outermost active cell regions EACR may each have an area less than that of each of the central active cell regions CACR. For example, the outermost active cell regions EACR may each have a width in the first direction D1 that is about 0.5 times a width in the first direction D1 of each of the central active cell regions CACR.

Active patterns ACT may be disposed on the active cell regions ACR of the substrate 100. The active patterns ACT may be spaced apart from each other in the first and second directions D1 and D2 that are parallel to a bottom surface 100a of the substrate 100. The first and second directions D1 and D2 may intersect each other. Each of the active patterns ACT may have a bar shape extending in a third direction D3 that is parallel to the bottom surface 100a of the substrate 100 and that intersects the first and second directions D1 and D2. The substrate 100 may have a portion that protrudes therefrom along a fourth direction D4 perpendicular to the bottom surface 100a of the substrate 100, and each of the active patterns ACT may be the protruding portion of the substrate 100. A portion of the active patterns ACT may be disposed on the interfacial region INF of the substrate 100.

A device isolation layer 102 may be disposed on the substrate 100, defining the active patterns ACT. The device isolation layer 102 may be disposed on the active cell region ACR and the interfacial region INF, and may be interposed between the active patterns ACT. The device isolation layer 102 may include, e.g., silicon oxide (SiO), silicon nitride (SiN), or silicon oxynitride (SiON).

The substrate 100 may include on the active cell region ACR word lines WL that run across the active patterns ACT and the device isolation layer 102. The word lines WL may be spaced apart from each other in the first direction D1, and may extend along the second direction D2. The number of the word lines WL disposed on one of the central active cell regions CACR may be the same as that of the word lines WL disposed on any other of the central active cell regions CACR. The number of the word lines WL disposed on each of the outermost active cell regions EACR may be less than that of the word lines WL disposed on each of the central active cell regions CACR. This will be further discussed below in detail together with a configuration of bit lines BL which will be discussed below. The word lines WL may be buried word lines disposed in the active patterns ACT and the device isolation layer 102.

Each of the word lines WL may include a gate electrode GE that penetrates upper portions of the active patterns ACT and the device isolation layer 102, a gate dielectric pattern GI interposed between the gate electrode GE and the active patterns ACT and between the gate electrode GE and the device isolation layer 102, and a gate capping pattern GC on a top surface of the gate electrode GE. The gate capping pattern GC may have a top surface coplanar with those of the active patterns ACT, e.g., the gate capping pattern GC may have a top surface coplanar with a topmost surface of the active pattern ACT. For example, the top surface of the gate capping pattern GC may be located at a same height from the bottom of the substrate 100 as that of the top surfaces of the active patterns ACT.

The gate electrode GE may include a conductive material. For example, the conductive material may include at least one of doped semiconductor materials (e.g., doped silicon (Si) or doped germanium (Ge)), conductive metal nitrides (e.g., titanium nitride (TiN) or tantalum nitride (TaN)), metals (e.g., tungsten (W), titanium (Ti), or tantalum (Ta)), and metal-semiconductor compounds (e.g., tungsten silicide (WSi), cobalt silicide ($CoSi_2$), or titanium silicide (TiSi)).

The gate dielectric pattern GI may include a dielectric material. For example, the gate dielectric pattern GI may include a silicon oxide (SiO) layer, a silicon nitride (SiN) layer, or a silicon oxynitride (SiON) layer.

The gate capping pattern GC may include a dielectric material. For example, the gate capping pattern GC may include a silicon oxide (SiO) layer, a silicon nitride (SiN) layer, or a silicon oxynitride (SiON) layer.

Each of the active patterns ACT may be provided therein with a first impurity region 110a and second impurity regions 110b. The second impurity regions 110b may be spaced apart from each other across the first impurity region 110a. The first impurity region 110a may be provided between a pair of word lines WL that run across the active patterns ACT. The second impurity regions 110b may be spaced apart from each other across the pair of word lines WL. The first impurity region 110a may include the same conductive impurity as that of the second impurity regions 110b.

A dielectric layer 120 may be disposed on the active cell region ACR and the interfacial region INF of the substrate 100, and may cover the active patterns ACT, the device isolation layer 102, and the word lines WL. The dielectric layer 120 may include, e.g., a single layer or multiple layers including at least one of a silicon oxide (SiO) layer, a silicon nitride (SiN) layer, and a silicon oxynitride (SiON) layer.

The substrate 100 may be provided with bit lines BL on the active cell region ACR and the dielectric layer 120. The bit lines BL may run across the word lines WL. For example, the bit lines BL may extend in the first direction D1 and may be spaced apart from each other in the second direction D2. Each of the bit lines BL may include a polysilicon pattern 130, an ohmic pattern 132, and a metal-containing pattern 134 that are sequentially stacked on the dielectric layer 120. The polysilicon pattern 130 may include impurity-doped polysilicon or impurity-undoped polysilicon. The ohmic pattern 132 may include metal silicide. The metal-containing pattern 134 may include at least one of metals (e.g., tungsten (W), titanium (Ti), or tantalum (Ta)) and conductive metal nitrides (e.g., titanium nitride (TiN), tantalum nitride (TaN), or tungsten nitride (WN)).

The bit lines BL may include first bit lines BL1 and second bit lines BL2 disposed on the outermost active cell region EACR, and may also include third bit lines BL3 and fourth bit lines BL4 disposed on the central active cell region CACR.

Bit-line pads BLPD may be disposed on the interfacial region INF. The bit-line pads BLPD may be spaced apart from each other in the second direction D2 on the interfacial region INF.

The following will describe in detail arrangements and shapes of the bit lines BL and the bit-line pads BLPD. With reference to FIGS. 3 and 4 that correspond to section A of FIG. 1, the following will describe an embodiment in which the outermost active cell region EACR is positioned at an outermost location in a direction opposite to the first direction D1. An arrangement and shape of the bit lines BL on the outermost active cell region EACR positioned at an outermost location in the first direction D1 may be symmetrical in the first direction D1 with those of the bit lines BL which will be discussed below.

As illustrated in FIGS. 2 and 3, on each outermost active cell region EACR, the first bit lines BL1 and the second bit lines BL2 may be alternately arranged along the second direction D2. The first bit lines BL1 and the second bit lines BL2 may extend toward a first interfacial region INF1 of the interfacial regions INF that is adjacent to the outermost active cell region EACR. The first interfacial region INF1 adjacent to the outermost active cell region EACR may be one of the interfacial regions INF that is positioned in a direction (or in the first direction D1 in the embodiment of FIG. 3) from the outermost active cell region EACR toward the central active cell region CACR. Differently from the embodiment of FIG. 3, when an outermost active cell region EACR is positioned at an outermost location in the first direction D1, the first bit lines BL1 and the second bit lines BL2 may extend toward another first interfacial region INF1 that is adjacent, along a direction opposite to the first direction D1, to the outermost active cell region EACR.

Among the first bit lines BL1 and the second bit lines BL2, a pair of neighboring first and second bit lines BL1 and BL2 may be connected to each other through a connection part CON. For example, the first and second bit lines BL1 and BL2 on the outermost active cell regions EACR may be configured in such a way that a plurality of pairs of first and second bit lines BL1 and BL2 connected to each other are arranged along the second direction D2. With respect to the pair of first and second bit lines BL1 and BL2, a first end BL1a in the first direction D1 of the first bit line BL1 may be connected through the connection part CON to a second end BL2a in the first direction D1 of the second bit line BL2. The first end BL1a of the first bit line BL1 and the second end BL2a of the second bit line BL2 may be end portions toward, e.g., facing, the bit-line pad BLPD on the interfacial region INF adjacent to the first and second ends BL1a and BL2a. For example, when viewed in a plan view, the first bit line BL1, the second bit line BL2, and the connection part CON may constitute a U shape.

For example, as illustrated in FIG. 3, the connection part CON may have a linear shape that extends in the second direction D2 between the first bit line BL1 and the second bit line BL2, e.g., the connection part CON may be perpendicular to each of the first and second bit lines BL1 and BL2. In another example, as illustrated in FIG. 4, the connection part CON may have a V shape when viewed in a plan view. For example, the connection part CON may have lines that extend in diagonal directions from the first end BL1a of the first bit line BL1 and the second end BL2a of the second bit line BL2, and the lines may meet each other on one side in the first direction D1 of the first bit line BL1 and the second bit line BL2, e.g., each of the lines of the connection part CON may extend at an oblique angle with respect to a corresponding one of the first and second bit lines BL1 and BL2.

On the first interfacial region INF1 of the interfacial regions INF that is adjacent to the outermost active cell region EACR, the bit-line pads BLPD may be positioned in the first direction D1 of the pair of first and second bit lines BL1 and BL2, e.g., the bit-line pads BLPD may be adjacent to respective pairs of the first and second bit lines BL1 and BL2 in the first direction D1. For example, one bit-line pad BLPD may be positioned, e.g., adjacent, in the first direction D1 to a corresponding pair of the first and second bit lines BL1 and BL2. When viewed in the second direction D2, the bit-line pad BLPD may be positioned between the first bit line BL1 and the second bit line BL2.

The bit-line pads BLPD may be connected through coupling parts CNT to the first and second bit lines BL1 and BL2. For example, each of the coupling parts CNT may extend from one connection part CON onto the first interfacial region INF1 to connect to a corresponding bit-line pad BLPD, thereby connecting the connection part CON to the bit-line pad BLPD. The coupling parts CNT may each have a linear shape that extends in the first direction D1.

A single unitary piece, e.g., an integral and seamless piece (FIG. 8), may be constituted by a pair of first and second bit lines BL1 and BL2 that are connected to each other, one connection part CON that connects the pair of first and second bit lines BL1 and BL2, and one coupling part CNT connected to the one connection part CON. For example, there may be a connection between the polysilicon pattern 130 of the first bit line BL1, the polysilicon pattern 130 of the second bit line BL2, the polysilicon pattern 130 of the connection part CON, and the polysilicon pattern 130 of the coupling part CNT, between the ohmic pattern 132 of the first bit line BL1, the ohmic pattern 132 of the second bit line BL2, the ohmic pattern 132 of the connection part CON, and the ohmic pattern 132 of the coupling part CNT, and between the metal-containing pattern 134 of the first bit line BL1, the metal-containing pattern 134 of the second bit line BL2, the metal-containing pattern 134 of the connection part CON, and the metal-containing pattern 134 of the coupling part CNT.

With reference to FIG. 5 that corresponds to section B of FIG. 1, the following will describe an embodiment in which the interfacial regions INF are positioned on opposite sides of the central active cell region CACR. As illustrated in FIGS. 2 and 5, on each central active cell region CACR, the third bit lines BL3 and the fourth bit lines BL4 may be alternately arranged along the second direction D2. The third bit lines BL3 may extend toward a second interfacial region INF2 of the interfacial regions INF that is adjacent along the first direction D1 to the central active cell region CACR, and the fourth bit lines BL4 may extend toward a third interfacial region INF3 of the interfacial regions INF that is adjacent, along a direction opposite to the first direction D1, to the central active cell region CACR.

On the second interfacial region INF2 adjacent to the central active cell region CACR, the bit-line pads BLPD may be correspondingly positioned, e.g., adjacent, in the first direction D1 of the third bit lines BL3. On the third interfacial region INF3 adjacent to the central active cell region CACR, the bit-line pads BLPD may be correspondingly positioned in a direction opposite to the first direction D1 of the fourth bit lines BL4.

The bit-line pads BLPD may be connected to the third and fourth bit lines BL3 and BL4. For example, the third bit lines BL3 may each extend along the first direction D1 onto the second interfacial region INF2 to thereby connect to one bit-line pad BLPD, and the fourth bit lines BL4 may each extend along a direction opposite to the first direction D1 onto the third interfacial region INF3 to thereby connect to one bit-line pad BLPD. The third and fourth bit lines BL3 and BL4 disposed on one central active cell region CACR may be connected to the bit-line pads BLPD disposed on the second and third interfacial regions INF2 and INF3 on opposite sides of the central active cell region CACR. For example, the bit lines BL3 and BL4 on the central active cell region CACR may be alternately connected to the bit-line pads BLPD that are arranged in the second direction D2 and are positioned on opposite sides of the central active cell region CACR.

Each of the outermost active cell regions EACR may be provided with the interfacial region INF (or the first interfacial region INF1) on only one side thereof. For example, each of the outermost active cell regions EACR may be provided with the bit-line pads BLPD on only one side thereof, and when connection of bit lines is achieved in the same way as that in the central active cell region CACR, half the number of bit lines may be used.

According to some embodiments, among the first and second bit lines BL1 and BL2 that are alternately arranged on the outermost active cell region EACR, neighboring first and second bit lines BL1 and BL2 may be simultaneously connected to one, e.g., to a same, bit-line pad BLPD positioned on one side of the neighboring first and second bit lines BL1 and BL2. Therefore, it may be possible to use all of the bit lines BL1 and BL2 provided on the outermost active cell region EACR. Accordingly, compared to a case where the first and second bit lines BL1 and BL2 are not connected to each other, it may be possible to double the number of cells that can be used on the outermost active cell region EACR or to halve an area of the outermost active cell region EACR. In conclusion, a semiconductor device may increase in electrical properties and decrease in size.

The number of the bit-line pads BLPD provided on the first interfacial region INF1 may be the same as that of the bit-line pads BLPD provided on each of the second and third interfacial regions INF2 and INF3. In this case, the outermost active cell region EACR may have a width, e.g., in the first direction D1, less than that of the central active cell region CACR, e.g., the width of the outermost active cell region EACR may be half the width of the central active cell region CACR in the first direction D1. In accordance with a difference in width between the outermost active cell region EACR and the central active cell region CACR, the number of the word lines WL provided on the outermost active cell region EACR may be different from that of the word lines WL provided on the central active cell region CACR. For example, as illustrated in FIG. 2, the number of the word lines WL disposed on each outermost active cell region EACR may be half of the word lines WL disposed on each central active cell region CACR. However, the number of the bit-line pads BLPD provided on the first interfacial regions INF1 may be changed if necessary.

Referring still to FIGS. 2 to 8, a lower capping pattern 140 and an upper capping pattern 142 may be sequentially stacked on each of the bit lines BL. The lower capping pattern 140 may be disposed between the upper capping pattern 142 and each of the bit lines BL.

The lower capping pattern 140 and the upper capping pattern 142 on each of the first and second bit lines BL1 and BL2 may extend, e.g., continuously, in the first direction D1 along a top surface of each of the first and second bit lines BL1 and BL2, the connection parts CON, and the coupling parts CNT on the outermost active cell region EACR and the first interfacial region INF1. The lower capping pattern 140 and the upper capping pattern 142 on each of the first and second bit lines BL1 and BL2 may extend onto each of the bit-line pads BLPD connected to the first and second bit lines BL1 and BL2 on the first interfacial region INF1.

The lower capping pattern 140 and the upper capping pattern 142 on each of the third bit lines BL3 may extend in the first direction D1 along a top surface of each of the third bit lines BL3 on the central active cell region CACR and the second interfacial region INF2. The lower capping pattern 140 and the upper capping pattern 142 on each of the third bit lines BL3 may extend onto each of the bit-line pads BLPD connected to the third bit lines BL3 on the second interfacial region INF2.

The lower capping pattern 140 and the upper capping pattern 142 on each of the fourth bit lines BL4 may extend in a direction opposite to the first direction D1 along a top surface of each of the fourth bit lines BL4 on the central active cell region CACR and the third interfacial region INF3. The lower capping pattern 140 and the upper capping pattern 142 on each of the fourth bit lines BL4 may extend onto each of the bit-line pads BLPD connected to the fourth bit lines BL4 on the third interfacial region INF3.

For example, the lower capping pattern 140 may include nitride (e.g., silicon nitride (SiN)) or oxynitride (e.g., silicon oxynitride (SiON)), and the upper capping pattern 142 may include nitride (e.g., silicon nitride (SiN)).

On the interfacial region INF, a separation dielectric pattern 145 may be disposed between the bit-line pads BLPD. The separation dielectric pattern 145 may extend in the first direction D1 between the bit-line pads BLPD and may, e.g., directly, contact lateral surfaces of the bit-line pads BLPD. On the second interfacial region INF2, the separation dielectric pattern 145 may be in, e.g., direct, contact with ends of the fourth bit lines BL4. On the third interfacial region INF3, the separation dielectric pattern 145 may be in, e.g., direct, contact with ends of the third bit lines BL3. On one side of the outermost active cell region EACR in a direction opposite to the first direction D1, the separation dielectric pattern 145 may be in, e.g., direct, contact with ends of the first and second bit lines BL1 and BL2.

The separation dielectric pattern 145 may extend between the lower capping patterns 140 on the bit-line pads BLPD and between the upper capping patterns 142 on the bit-line pads BLPD. The separation dielectric pattern 145 and the upper capping patterns 142 may be in contact with each other without interfaces therebetween, e.g., may be in direct contact with each other to form a single unitary piece. The separation dielectric pattern 145 may penetrate the dielectric layer 120 on the interfacial region INF to extend into the substrate 100 and the device isolation layer 102. The separation dielectric pattern 145 may include the same material as that of the upper capping patterns 142. For example, the separation dielectric pattern 145 may include silicon nitride (SiN).

On the interfacial region INF of the substrate 100, interfacial spacers ILSP may be correspondingly disposed on lateral surfaces of the bit-line pads BLPD. The separation dielectric pattern 145 may extend along the first direction D1 from between the bit-line pads BLPD to between the interfacial spacers ILSP. An interfacial dielectric layer IL may be disposed on the interfacial region INF of the substrate 100, and may cover lateral surfaces of the interfacial spacers ILSP and a lateral surface of the separation dielectric pattern 145.

The bit lines BL may be provided thereunder with bit-line contacts DC that are spaced apart from each other in the first direction D1. The bit-line contacts DC may be disposed on the active cell region ACR. Each of the bit-line contacts DC may penetrate the polysilicon pattern 130 and the dielectric layer 120, and may be electrically connected to the first impurity region 110$a$ of each of the active patterns ACT. The ohmic pattern 132 and the metal-containing pattern 134 may cover top surfaces of the bit-line contacts DC. For example, the bit-line contacts DC may include one of semiconductor materials (e.g., doped silicon (Si) or doped germanium (Ge)), conductive metal nitrides (e.g., titanium nitride (TiN) or tantalum nitride (TaN)), metals (e.g., tungsten (W), titanium (Ti), or tantalum (Ta)), and metal-semiconductor compounds (e.g., tungsten silicide (WSi), cobalt silicide (CoSi$_2$), or titanium silicide (TiSi)).

A bit-line spacer 150 may be disposed on a lateral surface of each of the bit lines BL. The bit-line spacer 150 may extend in the first direction D1 along the lateral surface of each of the bit lines BL. The bit-line spacer 150 may extend from the lateral surface of each of the bit lines BL onto a lateral surface of the lower capping pattern 140 and a lateral surface of the upper capping pattern 142.

The bit-line spacer 150 may include a first spacer 151, a second spacer 155, and a third spacer 157 that are sequentially stacked on the lateral surface of each of the bit lines BL. The first spacer 151 and the second spacer 155 may be disposed on the dielectric layer 120, and each of the first and second spacers 151 and 155 may have a lowermost surface in contact with a top surface of the dielectric layer 120. The third spacer 157 may cover a lateral surface of the dielectric layer 120, and may have a lowermost surface in contact with a top surface of the substrate 100. The first, second, and third spacers 151, 155, and 157 may extend onto the lateral surface of the lower capping pattern 140 and the lateral surface of the upper capping pattern 142. The first and third spacers 151 and 157 may include the same dielectric material (e.g., silicon nitride (SiN)). The second spacer 155 may include a dielectric material (e.g., silicon oxide (SiO)) having an etch selectivity with respect to the first and third spacers 151 and 157. Alternatively, the second spacer 155 may be an air gap region.

A buried dielectric pattern 153 may be disposed on a lateral surface of each of the bit-line contacts DC. The buried dielectric pattern 153 may include at least one of, e.g., silicon oxide (SiO), silicon nitride (SiN), and silicon oxynitride (SiON). The first spacer 151 may extend between the buried dielectric pattern 153 and the lateral surface of each of the bit-line contacts DC, and may further extend between the device isolation layer 102 and the buried dielectric pattern 153. A dielectric liner 152 may be interposed between the first spacer 151 and the buried dielectric pattern 153. The buried dielectric pattern 153 may be spaced apart from the first spacer 151 across the dielectric liner 152. At least a portion of the dielectric liner may extend between the first spacer 151 and the third spacer 157, and may contact the lowermost surface of the second spacer 155. The buried dielectric pattern 153 may be in contact with the lowermost surface of the third spacer 157. The dielectric liner 152 may include, e.g., silicon oxide (SiO).

Between a pair of first and second bit lines BL1 and BL2 that are connected to each other, the first, second, and third spacers 151, 155, and 157 on a lateral surface of each of the pair of the first and second bit lines BL1 and BL2 may extend onto a lateral surface of the connection part CON. Between two pairs of first and second bit lines BL1 and BL2 that are connected to each other, the first, second, and third spacers 151, 155, and 157 on the lateral surface of each of the pair of first and second bit lines BL1 and BL2 may extend along the first direction D1 onto a lateral surface of the separation dielectric pattern 145. Between the third bit lines BL3 and the fourth bit lines BL4, the first, second, and third spacers 151, 155, and 157 on a lateral surface of each of the third and fourth bit lines BL3 and BL4 may extend along the first direction D1 and its opposite direction onto the lateral surface of the separation dielectric pattern 145.

A pair of neighboring bit linens BL may be provided with storage node contacts BC therebetween. The storage contacts BC may be spaced apart from each other in the first direction D1. The storage node contacts BC may be disposed on the active cell region ACR. Each of the storage node contacts BC may be electrically connected to a corresponding one of the second impurity regions 110b on each of the active patterns ACT. The storage node contacts BC may include impurity-doped polysilicon or impurity-undoped polysilicon. The bit-line spacer 150 may be interposed between each of the bit lines BL and a corresponding one of the storage node contacts BC.

Dielectric fences may be disposed between the storage node contacts BC. The dielectric fences and the storage node contacts BC may be disposed alternately in the first direction D1 between a pair of bit lines BL. The dielectric fences may include, e.g., silicon nitride (SiN).

Landing pads LP may be correspondingly disposed on the storage node contacts BC on the active cell region ACR. An upper portion of each of the landing pads LP may cover a top surface of the upper capping pattern 142 and may have a width greater than that of each of the storage node contacts BC, e.g., a width of a top surface of the landing pad LP may be larger than a width of a top surface of the storage node contact BC along the second direction D2. The upper portion of each of the landing pads LP may be shifted, e.g., offset, in the second direction D2 or its opposite direction from each of the storage node contacts BC. The upper portion of each of the landing pads LP may vertically overlap a corresponding one of the bit lines BL. The landing pads LP may include a metallic material, such as tungsten (W).

A storage node ohmic layer and a diffusion stop pattern may be interposed between each of the storage node contacts BC and each of the landing pads LP. The storage node ohmic layer may include, e.g., metal silicide. The diffusion stop pattern may include a metal nitride, e.g., titanium nitride (TiN) or tantalum nitride (TaN).

A first upper dielectric layer 160 may fill a space between the landing pads LP on the active cell region ACR. The first upper dielectric layer 160 may penetrate the upper capping pattern 142 and a portion of the lower capping pattern 140, and may contact top surfaces of the first, second, and third spacers 151, 155, and 157. The first upper dielectric layer 160 may include, e.g., at least one of silicon oxide (SiO), silicon nitride (SiN), and silicon oxynitride (SiON).

Connection structures CNS may be located on the interfacial region INF, and may be correspondingly disposed on the bit-line pads BLPD. Each of the connection structures CNS may include a connection contact 200 that penetrates the upper and lower capping patterns 142 and 140, and is connected to each of the bit-line pads BLPD, and may also include a connection conductive line 210 on the connection contact 200. The connection conductive line 210 may extend onto the upper capping pattern 142 on each of the bit-line pads BLPD, and may be electrically connected to peripheral circuits (e.g., the peripheral blocks 2 and 3 of FIG. 1) on a peripheral region. The connection contact 200 and the connection conductive line 210 may include the same material as that of the landing pads LP.

The first upper dielectric layer 160 may extend onto the interfacial region INF to fill a space between the connection structures CNS. The first upper dielectric layer 160 may fill a space between the connection conductive lines 210 of the connection structures CNS, and a portion of the first upper dielectric layer 160 may extend into the separation dielectric pattern 145.

Bottom electrodes BE may be located on the active cell region ACR and may be correspondingly disposed on the landing pads LP. For example, the bottom electrodes BE may include at least one of an impurity doped polysilicon layer, a metal nitride layer (e.g., a titanium nitride (TiN) layer), and a metal layer (e.g., a tungsten (W) layer, an aluminum (Al) layer, or a copper (Cu) layer). For example, each of the bottom electrodes BE may have a circular pillar shape, a hollow cylindrical shape, or a cup shape. An upper support pattern 182 may support upper sidewalls of the bottom electrodes BE, and a lower support pattern 180 may support lower sidewalls of the bottom electrodes BE. For example, the upper and lower support patterns 182 and 180 may include a dielectric material, e.g., silicon nitride (SiN), silicon oxide (SiO), or silicon oxynitride (SiON).

An etch stop layer 170 may cover the first upper dielectric layer 160 between the bottom electrodes BE. For example, the etch stop layer 170 may include a dielectric material, e.g., silicon nitride (SiN), silicon oxide (SiO), or silicon oxynitride (SiON).

A dielectric layer 175 may cover surfaces of the bottom electrodes BE and surfaces of the upper and lower support patterns 182 and 180. The dielectric layer 175 may include, e.g., at least one of a silicon oxide (SiO) layer, a silicon nitride (SiN) layer, a silicon oxynitride (SiON) layer, and a high-k dielectric layer (e.g., hafnium oxide ($HfO_2$) layer).

A top electrode TE may be disposed on the dielectric layer 175, and may fill a space between the bottom electrodes BE. For example, the top electrode TE may include at least one of an impurity doped polysilicon (Si) layer, an impurity-doped silicon-germanium (SiGe) layer, a metal nitride layer (e.g., a titanium nitride (TiN) layer), and a metal layer (e.g., a tungsten (W) layer, an aluminum (Al) layer, or a copper (Cu) layer).

The bottom electrodes BE, the dielectric layer 175, and the top electrode TE may constitute a plurality of capacitors CAP.

On the interfacial region INF, a second upper dielectric layer 190 may be disposed on the first upper dielectric layer 160. The second upper dielectric layer 190 may cover a lateral surface of the capacitor CAP (or a lateral surface of the top electrode TE) and top surfaces of the connection structures CNS. The second upper dielectric layer 190 may cover top surfaces of the connection conductive lines 210. The second upper dielectric layer 190 may include, e.g., at least one of silicon oxide (SiO), silicon nitride (SiN), and silicon oxynitride (SiON).

Figure 9:
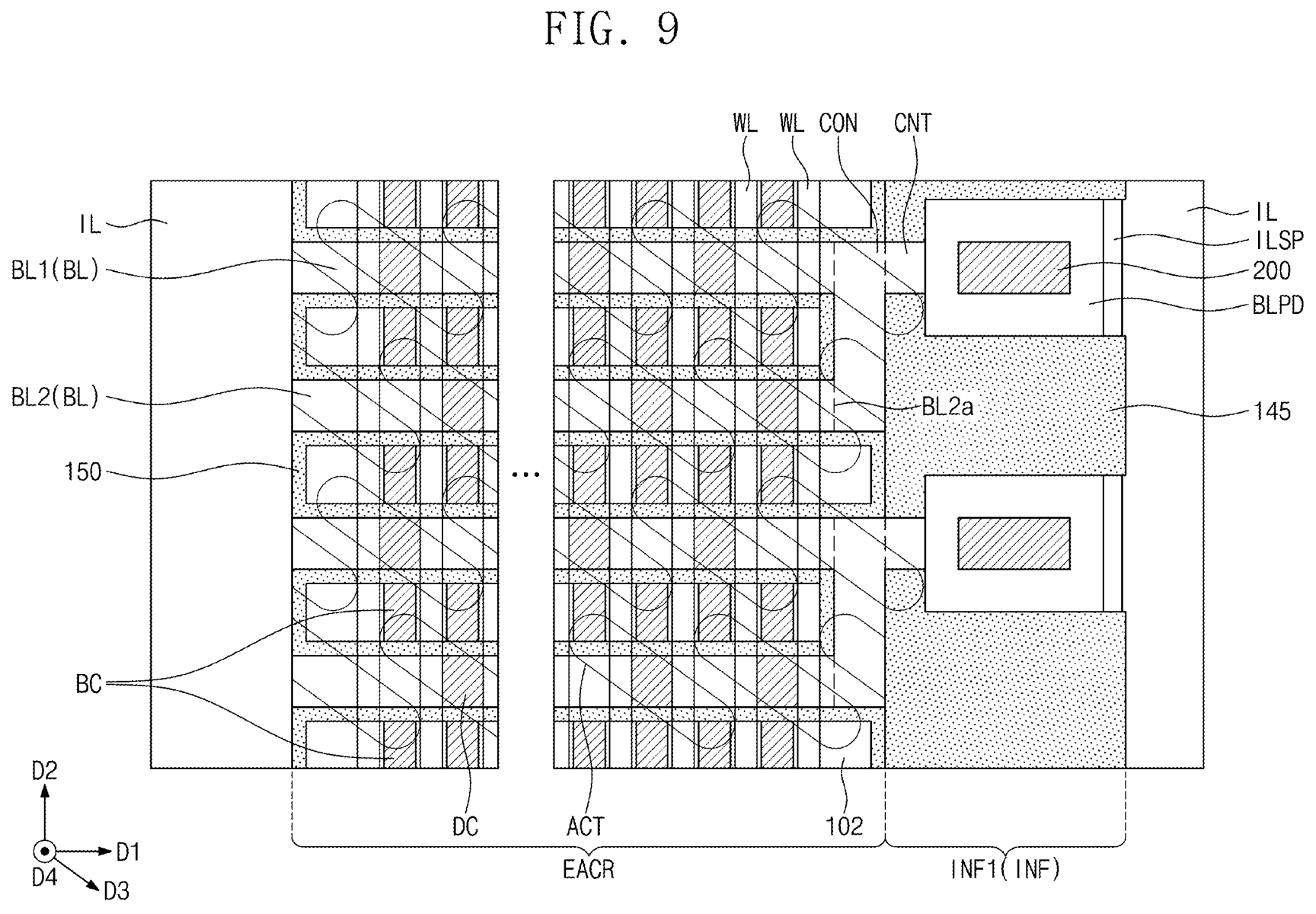
Figure 10:
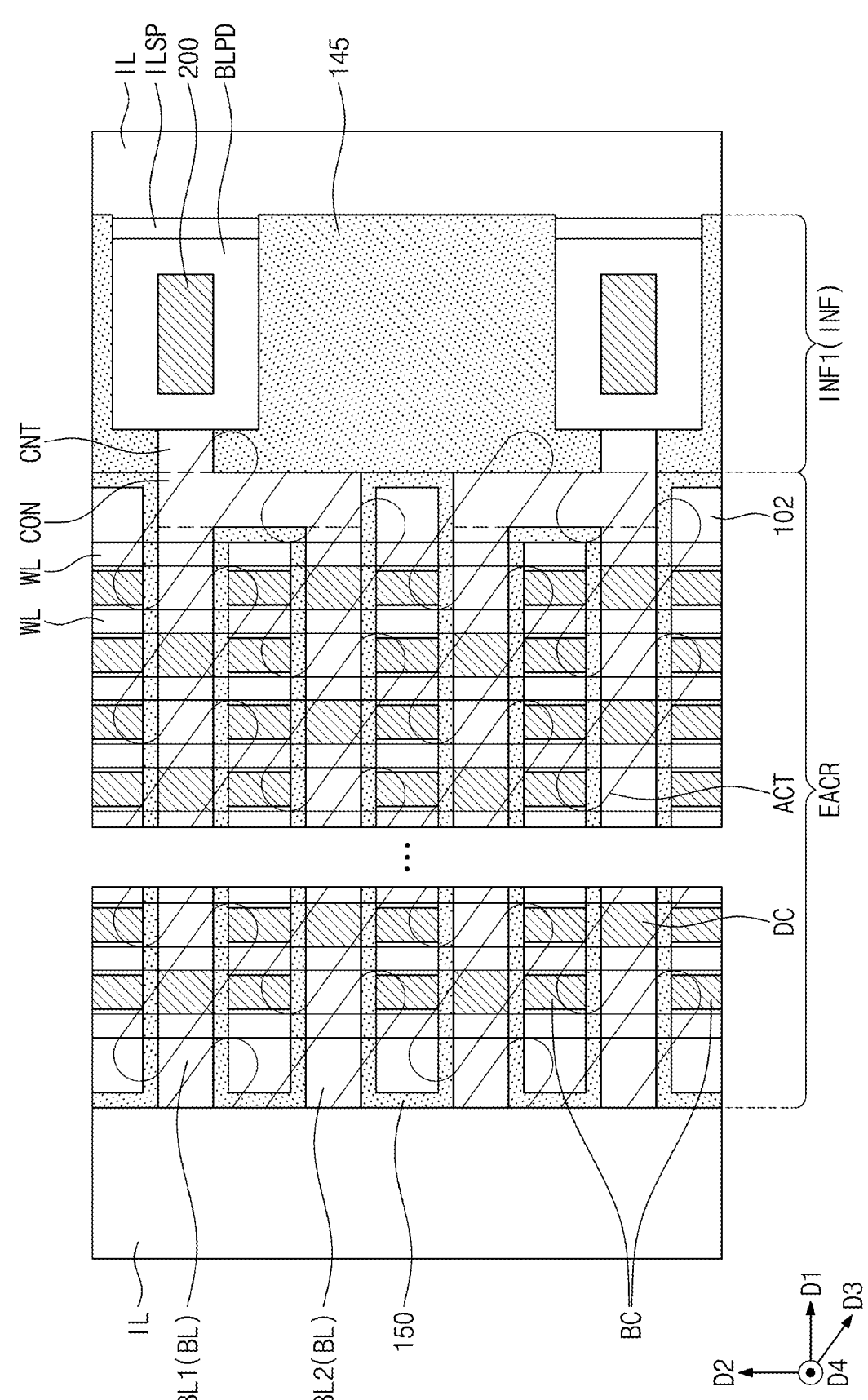

FIGS. 9 and 10 illustrate plan views of section A depicted in FIG. 1, showing a semiconductor device according to some embodiments. In the embodiments that follow, a detailed description of elements described previously with reference to FIGS. 1 to 8 will be omitted, and a difference thereof will be discussed in detail. The same reference numerals will be allocated to the same or similar components as those of the semiconductor device discussed above.

Referring to FIG. 9, on each outermost active cell region EACR, the first bit lines BL1 and the second bit lines BL2 may be alternately arranged along the second direction D2. The first bit lines BL1 and the second bit lines BL2 may extend toward the first interfacial region INF1 of the interfacial regions INF that is adjacent along the first direction D1 to the outermost active cell region EACR.

On the first interfacial region INF1 of the interfacial regions INF that is adjacent to the outermost active cell region EACR, the bit-line pads BLPD may be positioned in the first direction D1 of a pair of neighboring first and second bit lines BL1 and BL2 among the first bit lines BL1 and the second bit lines BL2. With reference to the pair of first and second bit lines BL1 and BL2, one bit-line pad BLPD may be positioned on one side in the first direction D1 of the first bit line BL1 among the pair of first and second bit lines BL1 and BL2, e.g., the bit-line pad BLPD may be adjacent to and overlap in the first direction D1 only the first bit line BL1 among the first and second bit lines BL1 and BL2. For example, the bit-line pad BLPD may not be provided on one side of, e.g., may not overlap, in the first direction D1 the second bit line BL2.

The bit-line pads BLPD may be connected through the coupling parts CNT to the pairs of first and second bit lines BL1 and BL2. For example, each of the coupling parts CNT may extend from one connection part CON onto the first interfacial region INF1, thereby being connected to one bit-line pad BLPD. In this case, the coupling part CNT may be a portion of one first bit line BL1 that extends, e.g., continuously and linearly, in the first direction D1 toward one of the bit-line pads BLPD. The coupling parts CNT may each have a linear shape that extends in the first direction D1.

The pair of first and second bit lines BL1 and BL2 may be connected to each other through the connection part CON. For example, the bit lines BL1 and BL2 on the outermost active cell regions EACR may be configured in such a way that a plurality of pairs of first and second bit lines BL1 and BL2 connected to each other are arranged along the second direction D2. With reference to the pair of first and second bit lines BL1 and BL2, the connection part CON may be connected from the second end BL2$a$ in the first direction D1 of the second bit line BL2 to the first bit line BL1 or the coupling part CNT connected to the first bit line BL1. The second end BL2$a$ of the second bit line BL2 may be an end portion directed toward, e.g., facing, the bit-line pad BLPD on the interfacial region INF adjacent thereto. For example, when viewed in a plan view, the first bit line BL1, the second bit line BL2, and the connection part CON may constitute an 'h' shape. The connection part CON may have a linear shape that extends in the second direction D2 between the first bit line BL1 and the second bit line BL2.

FIG. 9 depicts that the bit-line pads BLPD are each provided on one side of the first bit line BL1. For example, as illustrated in FIG. 9, the bit-line pad BLPD may be provided adjacent to only the first bit line BL1 among the first and second bit lines BL1 and BL2.

Referring to FIG. 10, on the first interfacial region INF1 of the interfacial regions INF that is adjacent to the outermost active cell region EACR, the bit-line pads BLPD may be positioned in the first direction D1 of a pair of neighboring first and second bit lines BL1 and BL2 among the first bit lines BL1 and the second bit lines BL2. On one side of a certain pair of first and second bit lines BL1 and BL2, one of the bit-line pads BLPD may be positioned on one side of the first bit line BL1 and may not be disposed on one side of the second bit line BL2. In addition, on one side of another pair of first and second bit lines BL1 and BL2 adjacent to the certain pair of first and second bit lines BL1 and BL2, another of the bit-line pads BLPD may be positioned on one side of the second bit line BL2 and may not be disposed on one side of the first bit line BL1. For example, one of the bit-line pads BLPD may be connected to each of a plurality of pairs of first and second bit lines BL1 and BL2 that are arranged in the second direction D2, and in this case, the bit-line pads BLPD may be alternately connected to the first and second bit lines BL1 and BL2 in each of the sequential pairs along the second direction D2.

Figure 11:
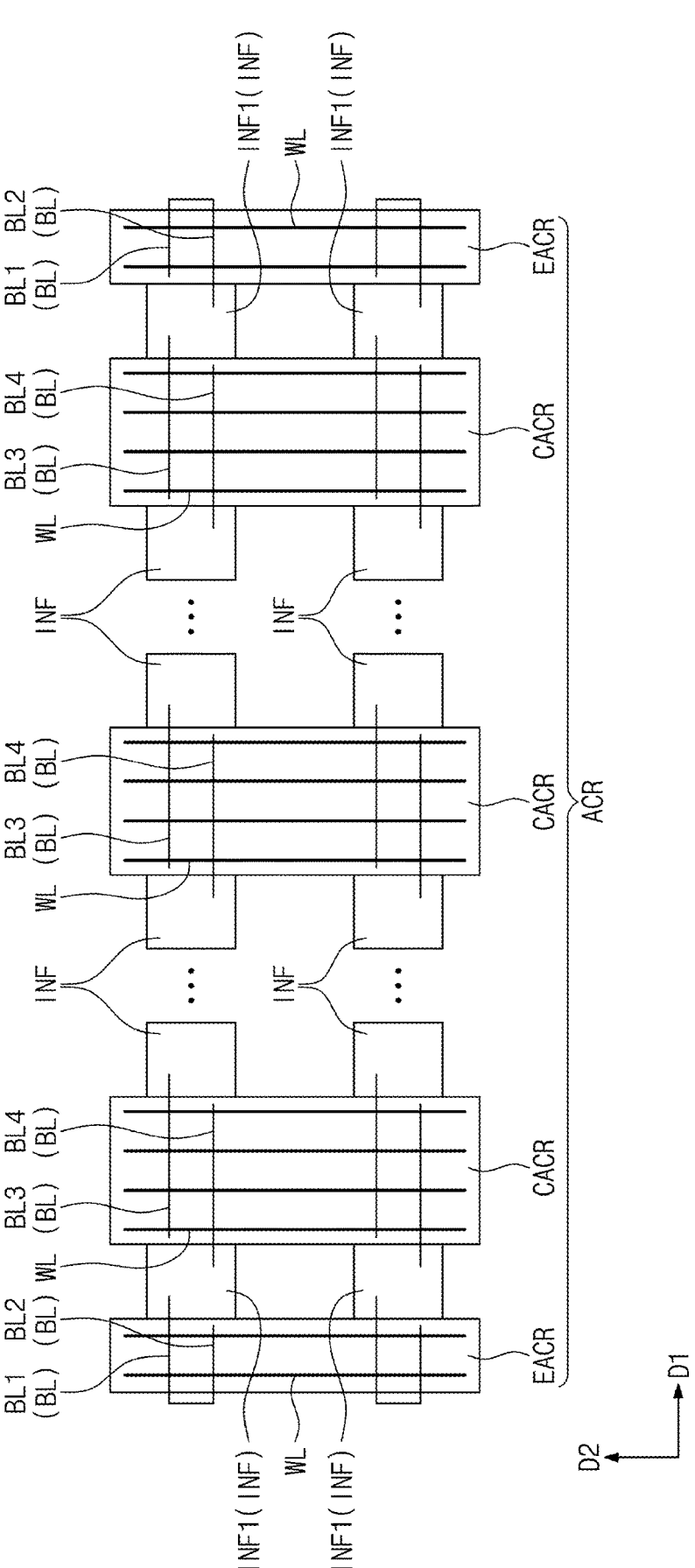
FIG. 11 illustrates a simplified schematic diagram showing an arrangement of bit lines in a semiconductor device according to some embodiments.
Figure 12:
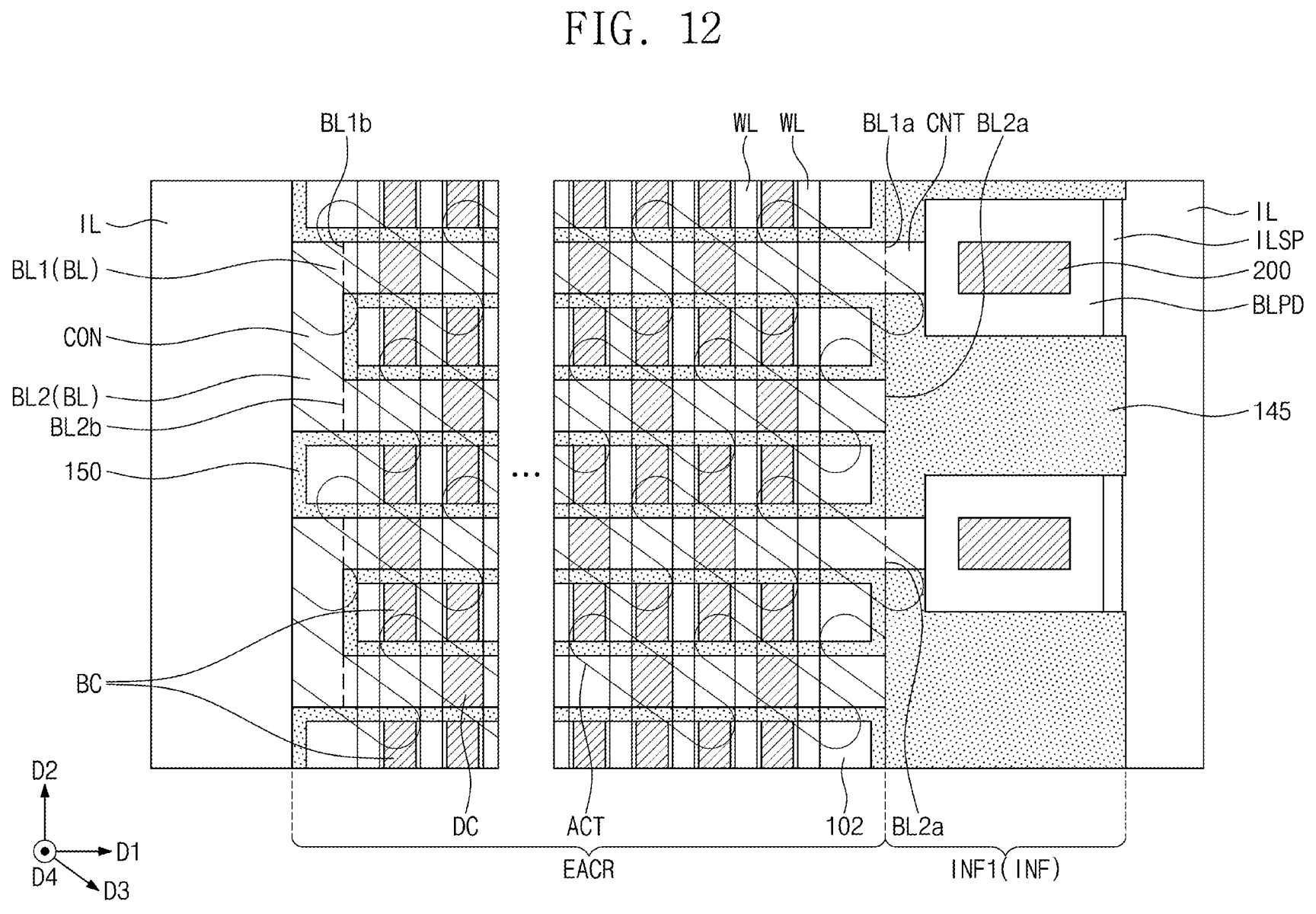
Figure 13:
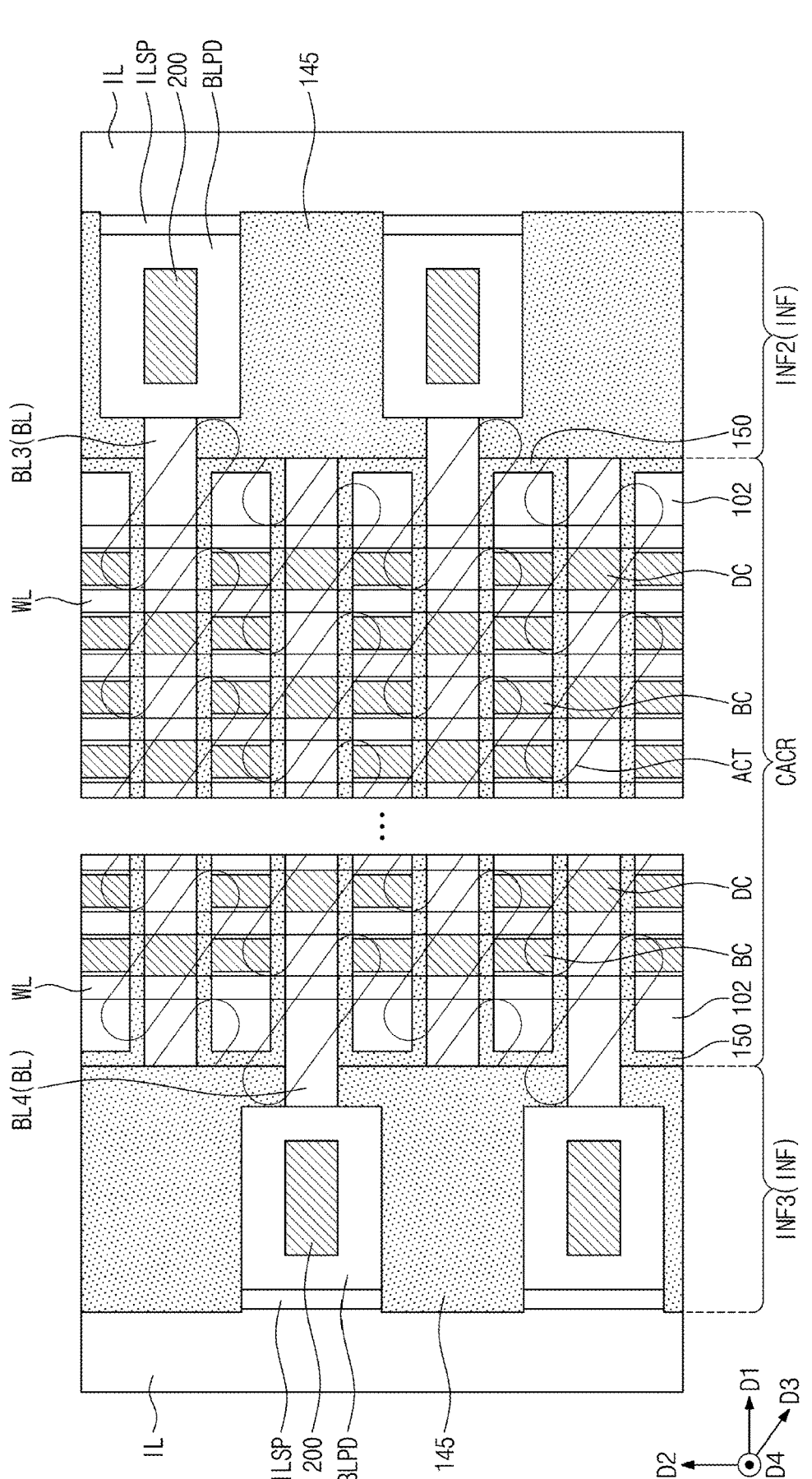
FIG. 13 illustrates a plan view of section B depicted in FIG. 1, showing a semiconductor device according to some embodiments.
Figure 14:
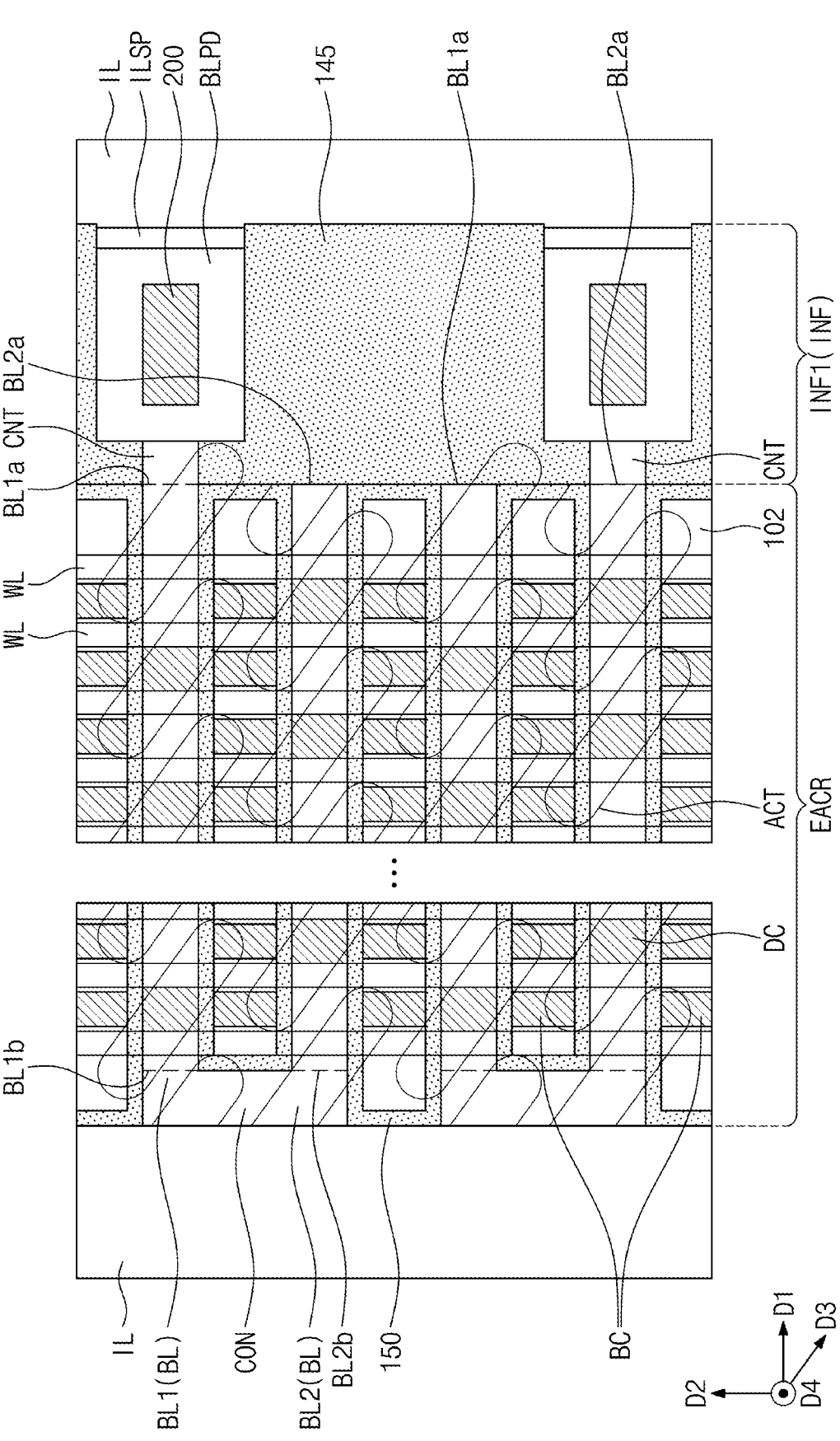
FIG. 14 illustrates a plan view of section A depicted in FIG. 1, showing a semiconductor device according to some embodiments.

FIG. 11 illustrates a simplified schematic diagram showing an arrangement of bit lines in a semiconductor device according to some embodiments. FIG. 12 illustrates a plan view of section A depicted in FIG. 1, showing a semiconductor device according to some embodiments. FIG. 13 illustrates a plan view of section B depicted in FIG. 1, showing a semiconductor device according to some embodiments. FIG. 14 illustrates a plan view of section A depicted in FIG. 1, showing a semiconductor device according to some embodiments.

Referring to FIGS. 1, 11, and 12, on each outermost active cell region EACR, the first bit lines BL1 and the second bit lines BL2 may be alternately arranged along the second direction D2. The first bit lines BL1 may extend toward the first interfacial region INF1 of the interfacial regions INF that is adjacent to the outermost active cell region EACR.

Among the first bit lines BL1 and the second bit lines BL2, a pair of neighboring first and second bit lines BL1 and BL2 may be connected to each other through the connection part CON. For example, the bit lines BL1 and BL2 on the outermost active cell regions EACR may be configured in such a way that a plurality of pairs of first and second bit lines BL1 and BL2 connected to each other may be arranged along the second direction D2. With reference to the pair of first and second bit lines BL1 and BL2, the first bit line BL1 and the second bit line BL2 may respectively have a third end BL1$b$ and a fourth end BL2$b$ in a direction opposite to the first direction D1, and the third end BL1$b$ and the fourth end BL2$b$ may be connected to each other through the connection part CON. The third end BL1$b$ of the first bit line BL1 and the fourth end BL2$b$ of the second bit line BL2 may be end portions toward the bit-line pad BLPD on the interfacial region INF adjacent to the third and fourth ends BL1$b$ and BL2$b$. For example, when viewed in a plan view, the first bit line BL1, the second bit line BL2, and the connection part CON may constitute a U shape. As illustrated in FIG. 12, the connection part CON may have a linear shape that extends in the second direction D2 between the first bit line BL1 and the second bit line BL2. Alternatively, the connection part CON may have a V shape or a curved shape when viewed in a plan view. For example, the connection part CON may have lines that extend in diagonal directions from the third end BL1$b$ of the first bit line BL1 and the fourth end BL2$b$ of the second bit line BL2, and the lines may meet each other on one side in a direction opposite to the first direction D1 of the first bit line BL1 and the second bit line BL2.

On the first interfacial region INF1 of the interfacial regions INF that is adjacent to the outermost active cell region EACR, the bit-line pads BLPD may be positioned in the first direction D1 of the first bit line BL1 and the second bit line BL2. With reference to the pair of first and second bit lines BL1 and BL2, one bit-line pad BLPD may be positioned on one side in the first direction D1 of the first bit line BL1 among the pair of first and second bit lines BL1 and BL2. For example, the bit-line pad BLPD may not be provided on one side in the first direction D1 of the second bit line BL2.

The bit-line pads BLPD may be connected through the coupling parts CNT to the first and second bit lines BL1 and BL2. For example, each of the coupling parts CNT may extend from the first end BL1$a$ of the first bit line BL1 onto the first interfacial region INF1, thereby being connected to one bit-line pad BLPD. In this case, the coupling part CNT may be a portion of one first bit line BL1 that extends in the first direction D1 toward one of the bit-line pads BLPD. The coupling parts CNT may each have a linear shape that extends in the first direction D1. For example, as illustrated in FIG. 12, the bit-line pad BLPD with the coupling part CNT may be at an opposite end of the first bit line BL1 relative to the connection part CON.

The second ends BL2a of the second bit lines BL2 may be in contact with the separation dielectric pattern 145 disposed between the bit-line pads BLPD.

A single unitary piece may be constituted by a pair of first and second bit lines BL1 and BL2 that are connected to each other, one connection part CON that connects to each other the pair of first and second bit lines BL1 and BL2, and one coupling part CNT connected to the one connection part CON. For example, there may be a connection between the polysilicon pattern 130 of the first bit line BL1, the polysilicon pattern 130 of the second bit line BL2, the polysilicon pattern 130 of the connection part CON, and the polysilicon pattern 130 of the coupling part CNT, between the ohmic pattern 132 of the first bit line BL1, the ohmic pattern 132 of the second bit line BL2, the ohmic pattern 132 of the connection part CON, and the ohmic pattern 132 of the coupling part CNT, and between the metal-containing pattern 134 of the first bit line BL1, the metal-containing pattern 134 of the second bit line BL2, the metal-containing pattern 134 of the connection part CON, and the metal-containing pattern 134 of the coupling part CNT.

Referring to FIGS. 1, 11, and 13, on each central active cell region CACR, the third bit lines BL3 and the fourth bit lines BL4 may be alternately arranged along the second direction D2. The third bit lines BL3 may extend toward the second interfacial region INF2 of the interfacial regions INF that is adjacent along the first direction D1 to the central active cell region CACR, and the fourth bit lines BL4 may extend toward the third interfacial region INF3 of the interfacial regions INF that is adjacent, along a direction opposite to the first direction D1, to the central active cell region CACR.

On the second interfacial region INF2 adjacent to the central active cell region CACR, the bit-line pads BLPD may be correspondingly positioned in the first direction D1 of the third bit lines BL3. On the third interfacial region INF3 adjacent to the central active cell region CACR, the bit-line pads BLPD may be correspondingly positioned in a direction opposite to the first direction D1 of the fourth bit lines BL4.

The bit-line pads BLPD may be connected to the third and fourth bit lines BL3 and BL4. For example, the third bit lines BL3 may each extend along the first direction D1 onto the second interfacial region INF2 to thereby connect to one bit-line pad BLPD, and the fourth bit lines BL4 may each extend along a direction opposite to the first direction D1 onto the third interfacial region INF3 to thereby connect to one bit-line pad BLPD. For example, the bit lines BL3 and BL4 on the central active cell region CACR may be alternately connected to the bit-line pads BLPD that are arranged in the second direction D2 and are positioned on opposite sides of the central active cell region CACR.

The outermost active cell region EACR may be provided with the interfacial region INF (or the first interfacial region INF1) on only one side thereof. For example, each of the outermost active cell regions EACR may be provided with the bit-line pads BLPD on only one side thereof, and when connection of bit lines is achieved in the same way as that in the central active cell region CACR, half the number of bit lines may be used.

According to some embodiments, among the first and second bit lines BL1 and BL2 that are alternately arranged on the outermost active cell region EACR, the second bit lines BL2 that are not in direct contact with the bit-line pads BLPD may be correspondingly connected to the first bit lines BL1. Therefore, the second bit lines BL2 may be connected through the first bit lines BL1 to the bit-line pads BLPD, and it may be possible to use all of the bit lines BL1 and BL2 provided on the outermost active cell region EACR. In conclusion, a semiconductor device may increase in integration and electrical properties.

FIG. 12 depicts that the bit-line pads BLPD are each provided on one side of the first bit line BL1.

Referring to FIG. 14, on the first interfacial region INF1 of the interfacial regions INF that is adjacent to the outermost active cell region EACR, the bit-line pads BLPD may be positioned in the first direction D1 of a pair of neighboring first and second bit lines BL1 and BL2 among the first bit lines BL1 and the second bit lines BL2. On one side of a certain pair of first and second bit lines BL1 and BL2, one of the bit-line pads BLPD may be positioned on one side of the first bit line BL1 and may not be disposed on one side of the second bit line BL2. In addition, on one side of another pair of first and second bit lines BL1 and BL2 adjacent to the certain pair of first and second bit lines BL1 and BL2, another of the bit-line pads BLPD may be positioned on one side of the second bit line BL2 and may not be disposed on one side of the first bit line BL1. For example, one of the bit-line pads BLPD may be connected to each of a plurality of pairs of first and second bit lines BL1 and BL2 that are arranged in the second direction D2, and in this case, the bit-line pads BLPD may be alternately connected to the first and second bit lines BL1 and BL2 of the pairs.

By way of summation and review, embodiments provide a highly integrated semiconductor device. Embodiments provide a compact-sized semiconductor device.

That is, a semiconductor device according to some embodiments may be configured such that a pair of neighboring bit lines on an outermost active cell region may be simultaneously connected to one bit-line pad positioned on one side of the neighboring bit lines. Therefore, it may be possible to use all of the lines provided on the outermost active cell region. Accordingly, compared to a case where the bit lines are not connected to each other, it may be possible to increase the number of cells that can be used on the outermost active cell region and to reduce an area of the outermost active cell region. In conclusion, a semiconductor device may increase in electrical properties and decrease in size.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:

a substrate including an active cell region and an interfacial region, the active cell region and the interfacial region being adjacent to each other in a first direction;

bit lines on the active cell region of the substrate, the bit lines being spaced apart from each other in a second direction that intersects the first direction; and bit-line pads on the interfacial region of the substrate, the bit-line pads being spaced apart from each other in the second direction, wherein each of the bit lines includes:

a first bit line and a second bit line that extend in the first direction, the first bit line and the second bit line being spaced apart from each other in the second direction;

a connection part that connects a first end of the first bit line to a second end of the second bit line; and a coupling part that connects one of the bit-line pads to one of the first bit line, the second bit line, and the connection part, and wherein the first bit line, the second bit line, the connection part, and the coupling part are a single unitary piece.

2. The semiconductor device as claimed in claim 1, wherein:

the first end of the first bit line is opposite to a third end of the first bit line, the third end being directed toward the bit-line pads, the second end of the second bit line is opposite to a fourth end of the second bit line, the fourth end being directed toward the bit-line pads, and the coupling part connects the one of the bit-line pads to one of the third end of the first bit line and the fourth end of the second bit line.

3. The semiconductor device as claimed in claim 2, wherein the coupling part is connected to the third end of the first bit line in all of the bit lines.

4. The semiconductor device as claimed in claim 2, wherein:

one of the bit lines is configured such that the coupling part is connected to the third end of the first bit line, and another of the bit lines that is adjacent to the one of the bit lines is configured such that the coupling part is connected to the fourth end of the second bit line.

5. The semiconductor device as claimed in claim 2, wherein each of the bit lines is positioned on one side in the first direction of the first bit line or is positioned on one side in the first direction of the second bit line.

6. The semiconductor device as claimed in claim 1, wherein:

the first end of the first bit line is directed toward the bit-line pads, the second end of the second bit line is directed toward the bit-line pads, and the coupling part connects the one of the bit-line pads to the connection part.

7. The semiconductor device as claimed in claim 6, wherein, when viewed in the second direction, each of the bit-line pads is between the first bit line and the second bit line of the bit lines.

8. The semiconductor device as claimed in claim 1, wherein the first bit line, the second bit line, and the connection part define a U shape, when viewed in a plan view.

9. A semiconductor device, comprising:

a substrate including active cell regions and interfacial regions between the active cell regions, the active cell regions being arranged in a first direction;

bit lines on the active cell regions of the substrate, the bit lines extending in the first direction and being spaced apart from each other in a second direction that intersects the first direction; and bit-line pads on the interfacial regions of the substrate, the bit-line pads being spaced apart from each other in the second direction, wherein the active cell regions include:

outermost active cell regions on opposite sides in the first direction; and central active cell regions between the outermost active cell regions, the central active cell regions being adjacent to each other in the first direction, wherein the bit lines include:

first bit lines and second bit lines that are alternately arranged along the second direction on the outermost active cell regions; and third bit lines and fourth bit lines that are alternately arranged along the second direction on the central active cell regions, wherein a pair of neighboring ones of the first bit lines and the second bit lines are connected to each other through a connection part, the connection part extending between the pair of neighboring ones of the first bit lines and the second bit lines, and wherein the third bit lines and the fourth bit lines are connected to different ones of the bit-line pads.

10. The semiconductor device as claimed in claim 9, wherein:

the first bit lines are connected to first ones of the bit-line pads, the first ones of the bit-line pads being adjacent to the first bit lines, and the second bit lines are not directly connected to the bit-line pads.

11. The semiconductor device as claimed in claim 10, wherein the pair of neighboring ones of the first bit lines and the second bit lines are configured such that:

the connection part connects a first end of one of the first bit lines to a second end of one of the second bit lines;

the first end is opposite to a third end of the one of the first bit lines, the third end being directed toward the interfacial regions; and the second end is opposite to a fourth end of the one of the second bit lines, the fourth end being directed toward the interfacial regions.

12. The semiconductor device as claimed in claim 9, wherein the connection part is connected to the bit-line pads adjacent to the connection part.

13. The semiconductor device as claimed in claim 12, wherein the connection part connects a third end of one of the first bit lines to a fourth end of one of the second bit lines, the third end and the fourth end facing toward the interfacial regions.

14. The semiconductor device as claimed in claim 9, wherein:

the third bit lines are connected to ones of the bit-line pads in the first direction of the third bit lines, and the fourth bit lines are connected to ones of the bit-line pads in a direction opposite to the first direction of the fourth bit lines.

15. The semiconductor device as claimed in claim 9, further comprising word lines on the active cell regions of the substrate, the word lines extending in the second direction and being spaced apart from each other in the first direction, and a number of the word lines on each of the central active cell regions is twice a number of the word lines on each of the outermost active cell regions.

16. The semiconductor device as claimed in claim 9, wherein, when viewed in the first direction, a width of each of the outermost active cell regions is less than a width of each of the central active cell regions.

17. A semiconductor device, comprising:

a substrate including an active cell region and an interfacial region, the active cell region and the interfacial region being adjacent to each other in a first direction;

word lines on the active cell region of the substrate, the word lines extending in a second direction that intersects the first direction and being spaced apart from each other in the first direction;

bit lines on the active cell region of the substrate, the bit lines extending in the first direction and being spaced apart from each other in the second direction; and bit-line pads on the interfacial region of the substrate and spaced apart from each other in the second direction, wherein, when viewed in a plan view, each of the bit lines has a U shape, each of the word lines twice crossing each of the bit lines, and wherein each of the bit lines is connected to one of the bit-line pads.

18. The semiconductor device as claimed in claim 17, wherein each of the bit lines includes:

a first line that extends in the first direction;

a second line that extends in the first direction and is spaced apart in the second direction from the first line; and a connection part that connects an end of the first line to an end of the second line, the end of the first line facing in a direction opposite to the first direction, and the end of the second line facing in the direction opposite to the first direction, and wherein the first line of each of the bit lines extends onto the interfacial region and connects to a corresponding one of the bit-line pads.

19. The semiconductor device as claimed in claim 17, wherein each of the bit lines includes:

a first line that extends in the first direction;

a second line that extends in the first direction and is spaced apart in the second direction from the first line; and a connection part that connects an end of the first line to an end of the second line, the end of the first line facing in the first direction, and the end of the second line facing in the first direction, and wherein the connection part of the bit lines extends onto the interfacial region and connects to a corresponding one of the bit-line pads.

* * * * *